US012575235B2

(12) United States Patent
    Liang et al.

(10) Patent No.: US 12,575,235 B2
(45) Date of Patent: Mar. 10, 2026

(54) ARRAY SUBSTRATE AND PREPARATION METHOD THEREFOR, AND DISPLAY APPARATUS

(71) Applicant: BOE Technology Group Co., Ltd., Beijing (CN)

(72) Inventors: Zhiwei Liang, Beijing (CN); Zhanfeng Cao, Beijing (CN); Ke Wang, Beijing (CN); Yingwei Liu, Beijing (CN); Shunyu Yao, Beijing (CN); Shuang Liang, Beijing (CN); Muxin Di, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 701 days.

(21) Appl. No.: 17/800,236

(22) PCT Filed: May 14, 2021

(86) PCT No.: PCT/CN2021/093904
    § 371 (c)(1),
    (2) Date: Aug. 17, 2022

(87) PCT Pub. No.: WO2021/238682
    PCT Pub. Date: Dec. 2, 2021

(65) Prior Publication Data
    US 2023/0060979 A1 Mar. 2, 2023

(30) Foreign Application Priority Data
    May 27, 2020 (CN) .......................... 202010461246.4

(51) Int. Cl.
    *H10H 20/857* (2025.01)
    *G09G 3/32* (2016.01)
    (Continued)

(52) U.S. Cl.
    CPC ............. *H10H 20/857* (2025.01); *G09G 3/32* (2013.01); *H10H 20/01* (2025.01);
    (Continued)

(58) Field of Classification Search
    CPC .. H10H 20/857; H10H 20/01; H10H 20/8312; H10H 20/032; H10H 20/0364;
    (Continued)

(56) References Cited

U.S. PATENT DOCUMENTS

| | | | |
|---|---|---|---|
| 10,388,678 B2 | 8/2019 | Chien | |
| 2018/0301475 A1 | 10/2018 | Chien | |

(Continued)

FOREIGN PATENT DOCUMENTS

| | | |
|---|---|---|
| CN | 106876260 A | 6/2017 |
| CN | 108172584 A | 6/2018 |

(Continued)

OTHER PUBLICATIONS

International Search Report issued Aug. 12, 2021 in International Application No. PCT/CN2021/093904, 4 pages.

(Continued)

*Primary Examiner* — Ratisha Mehta
*Assistant Examiner* — Thaddeus J Kolb
(74) *Attorney, Agent, or Firm* — XSENSUS LLP

(57) ABSTRACT

A method for manufacturing an array substrate and an array substrate are provided. The method includes: providing a base substrate; forming a driving circuit layer at a side of the base substrate; and forming a functional device layer at a side of the driving circuit layer. Forming the driving circuit layer includes forming at least one first lead layer. Forming the first lead layer includes: forming a conductive seed layer at the side of the base substrate; forming a removable pattern-defining layer on a surface of the conductive seed layer, the removable pattern-defining layer being provided (Continued)

with a lead opening exposing a part of the conductive seed layer; forming, in the lead opening, a metal plating layer on the surface of the conductive seed layer; removing the removable pattern-defining layer; and removing a part of the conductive seed layer not covered by the metal plating layer.

7 Claims, 13 Drawing Sheets

(51) Int. Cl.
    *H10H 20/01*          (2025.01)
    *H10H 20/831*         (2025.01)

(52) U.S. Cl.
    CPC ....... *H10H 20/8312* (2025.01); *H10H 20/032* (2025.01); *H10H 20/0364* (2025.01)

(58) Field of Classification Search
    CPC ...... H10H 29/142; G09G 3/32; G09G 3/3406; G09G 2300/0426; G09G 2320/0204; H10D 86/441; H10D 86/60; H10D 86/021; H01L 25/0753; H01L 25/167; H01L 21/77; G09F 9/33
    See application file for complete search history.

(56) References Cited

U.S. PATENT DOCUMENTS

| | | | |
|---|---|---|---|
| 2019/0148348 A1* | 5/2019 | Brodoceanu | ......... H10H 20/018 |
| | | | 438/23 |
| 2019/0196285 A1 | 6/2019 | Zhou et al. | |
| 2019/0252487 A1* | 8/2019 | Wang | ................. H10K 59/1315 |
| 2020/0286921 A1 | 9/2020 | Liu et al. | |
| 2021/0050497 A1 | 2/2021 | Li et al. | |
| 2023/0266528 A1* | 8/2023 | Tai | ........................... G02B 6/13 |
| | | | 385/14 |

FOREIGN PATENT DOCUMENTS

| | | | | |
|---|---|---|---|---|
| CN | 109887948 A | | 6/2019 | |
| CN | 110429089 A | * | 11/2019 | ............. H10H 20/01 |
| CN | 111051975 A | | 4/2020 | |
| KR | 10-0678860 B1 | | 2/2007 | |
| WO | WO-2010140725 A1 | * | 12/2010 | ....... H01L 21/76852 |

OTHER PUBLICATIONS

Written Opinion of the International Searching Authority issued Aug. 12, 2021 in International Application No. PCT/CN2021/093904, 4 pages.

* cited by examiner

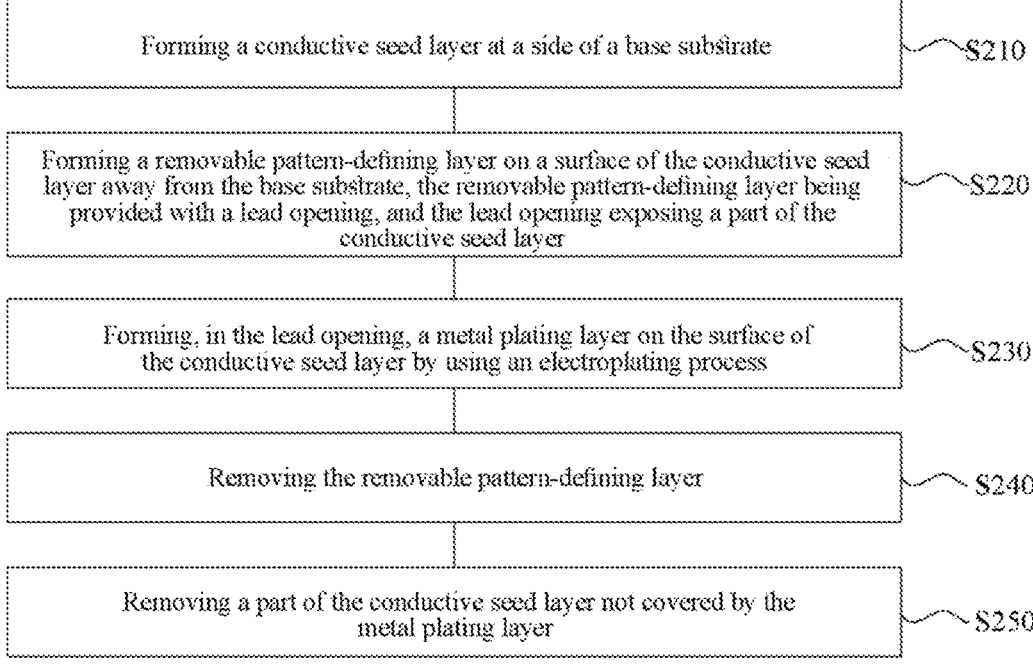

| | |
|---|---|
| Forming a conductive seed layer at a side of a base substrate | S210 |
| Forming a removable pattern-defining layer on a surface of the conductive seed layer away from the base substrate, the removable pattern-defining layer being provided with a lead opening, and the lead opening exposing a part of the conductive seed layer | S220 |
| Forming, in the lead opening, a metal plating layer on the surface of the conductive seed layer by using an electroplating process | S230 |
| Removing the removable pattern-defining layer | S240 |
| Removing a part of the conductive seed layer not covered by the metal plating layer | S250 |

FIG. 3

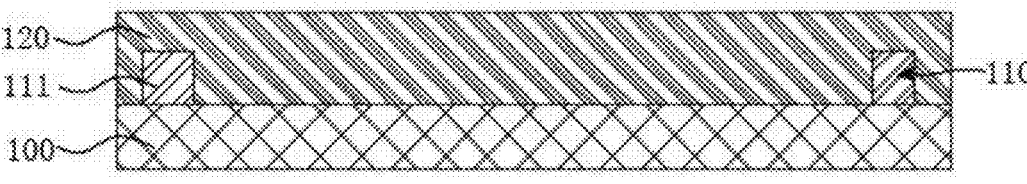

FIG. 4

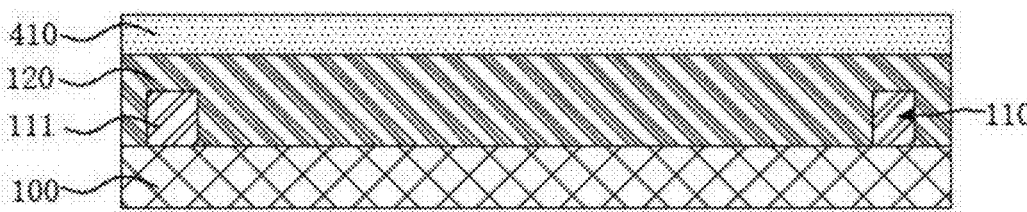

FIG. 5

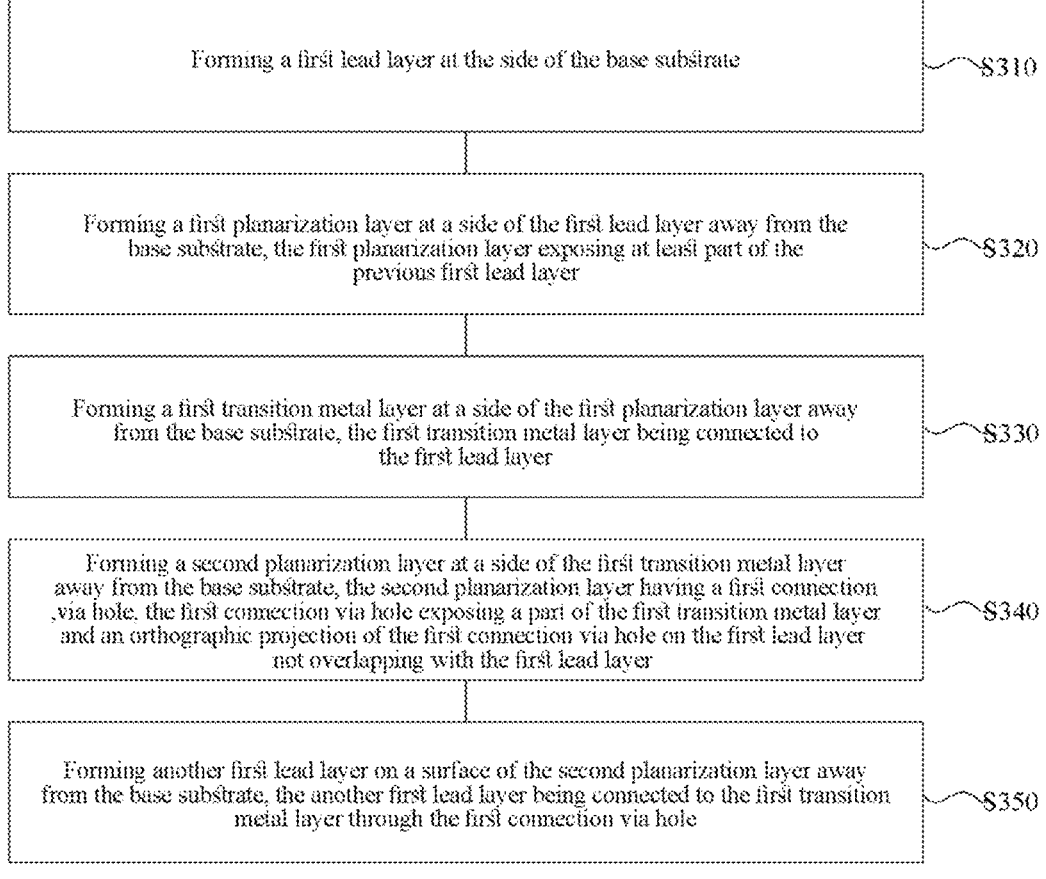

Forming a first lead layer at the side of the base substrate    S310

Forming a first planarization layer at a side of the first lead layer away from the base substrate, the first planarization layer exposing at least part of the previous first lead layer    S320

Forming a first transition metal layer at a side of the first planarization layer away from the base substrate, the first transition metal layer being connected to the first lead layer    S330

Forming a second planarization layer at a side of the first transition metal layer away from the base substrate, the second planarization layer having a first connection via hole, the first connection via hole exposing a part of the first transition metal layer and an orthographic projection of the first connection via hole on the first lead layer not overlapping with the first lead layer    S340

Forming another first lead layer on a surface of the second planarization layer away from the base substrate, the another first lead layer being connected to the first transition metal layer through the first connection via hole    S350

FIG. 11

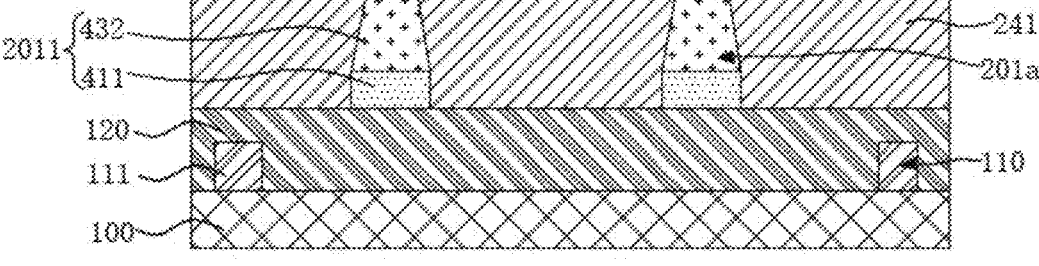

FIG. 12

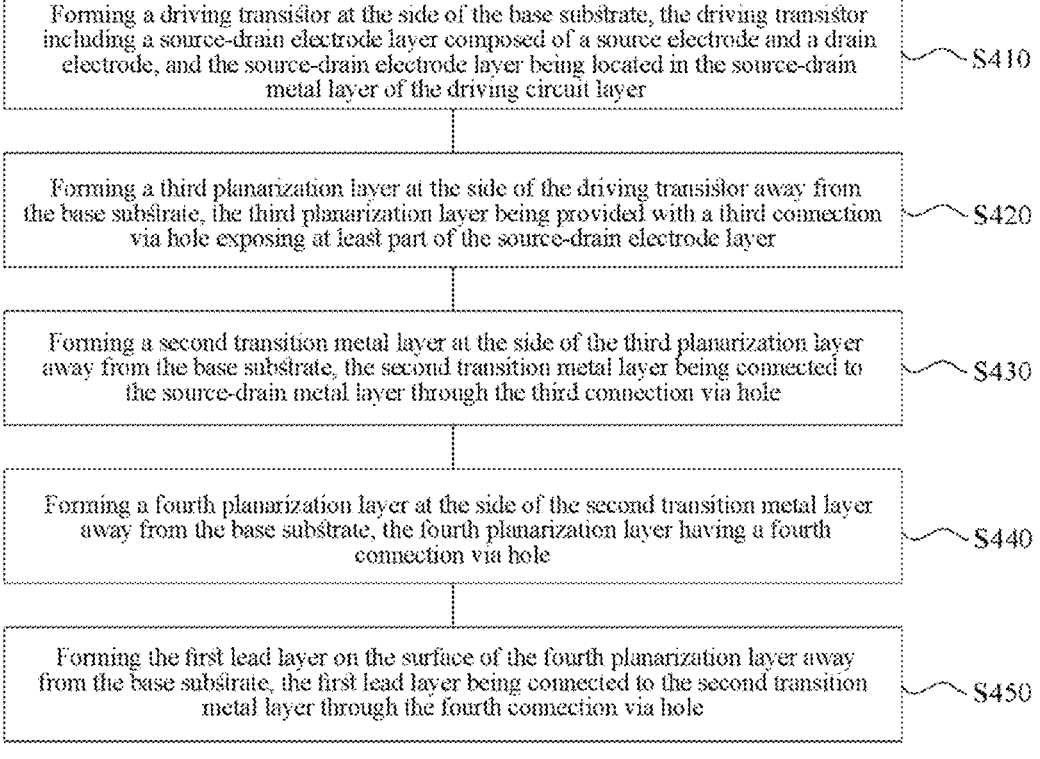

Forming a driving transistor at the side of the base substrate, the driving transistor including a source-drain electrode layer composed of a source electrode and a drain electrode, and the source-drain electrode layer being located in the source-drain metal layer of the driving circuit layer ⟩～S410

Forming a third planarization layer at the side of the driving transistor away from the base substrate, the third planarization layer being provided with a third connection via hole exposing at least part of the source-drain electrode layer ⟩～S420

Forming a second transition metal layer at the side of the third planarization layer away from the base substrate, the second transition metal layer being connected to the source-drain metal layer through the third connection via hole ⟩～S430

Forming a fourth planarization layer at the side of the second transition metal layer away from the base substrate, the fourth planarization layer having a fourth connection via hole ⟩～S440

Forming the first lead layer on the surface of the fourth planarization layer away from the base substrate, the first lead layer being connected to the second transition metal layer through the fourth connection via hole ⟩～S450

FIG. 19

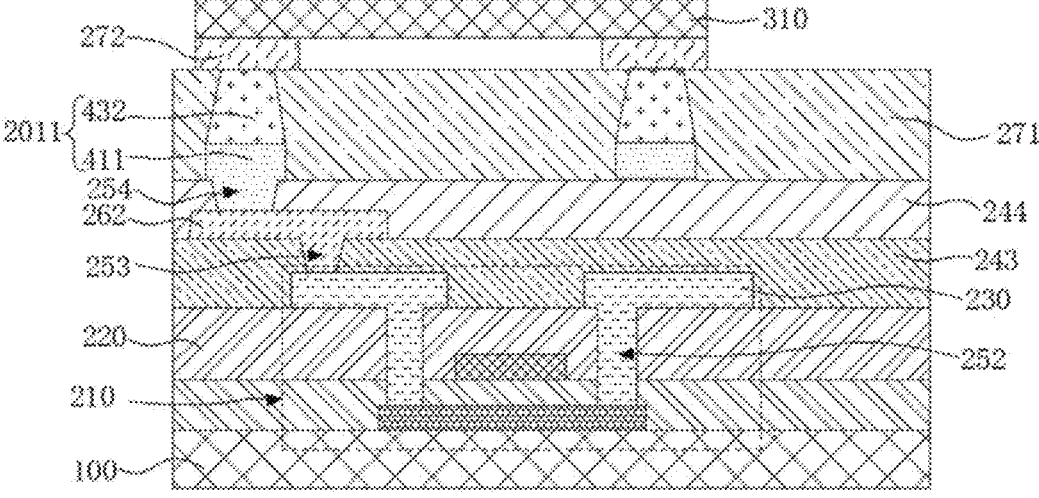

FIG. 20

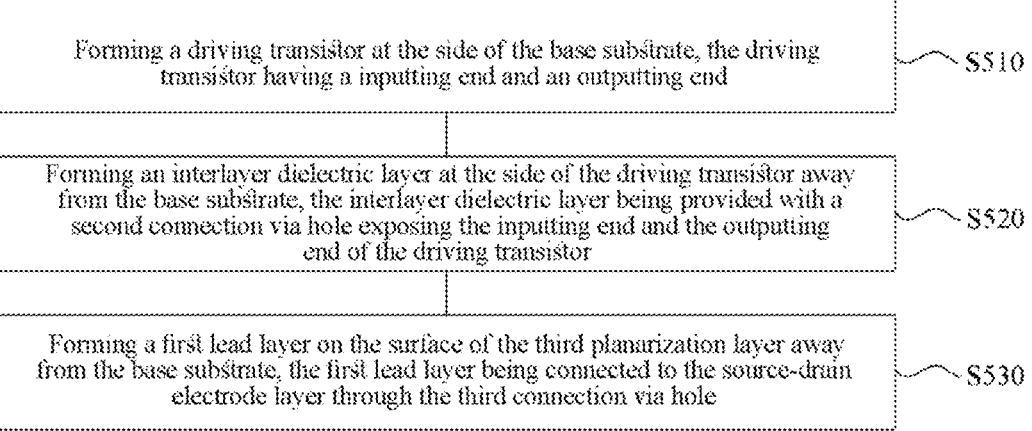

| | |
|---|---|
| Forming a driving transistor at the side of the base substrate, the driving transistor having a inputting end and an outputting end | S510 |
| Forming an interlayer dielectric layer at the side of the driving transistor away from the base substrate, the interlayer dielectric layer being provided with a second connection via hole exposing the inputting end and the outputting end of the driving transistor | S520 |
| Forming a first lead layer on the surface of the third planarization layer away from the base substrate, the first lead layer being connected to the source-drain electrode layer through the third connection via hole | S530 |

FIG. 21

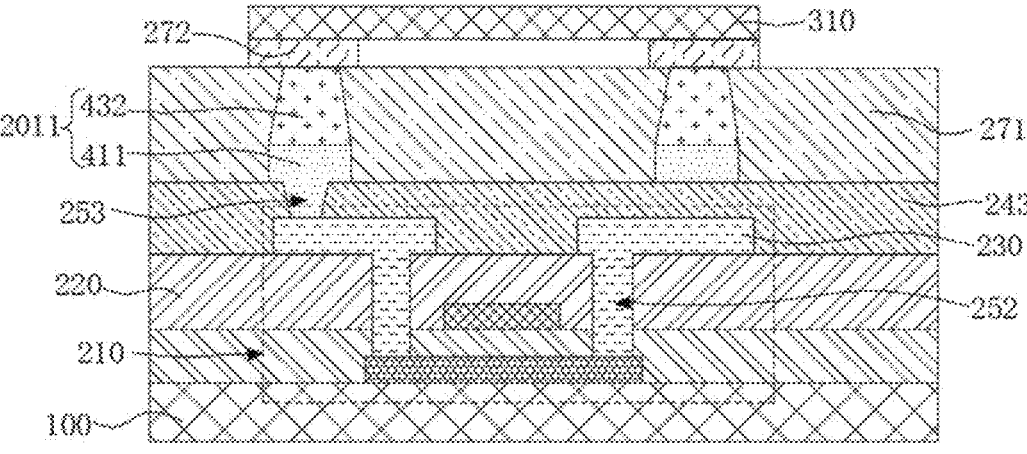

FIG. 22

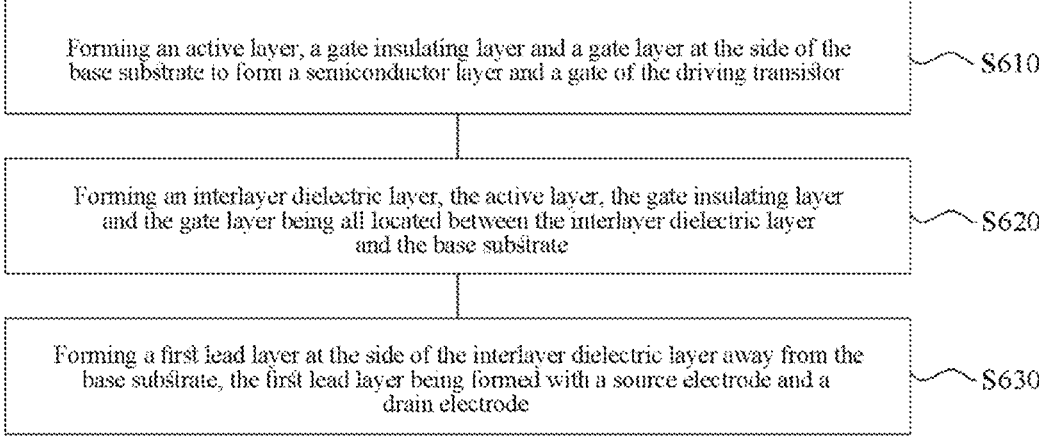

Forming an active layer, a gate insulating layer and a gate layer at the side of the base substrate to form a semiconductor layer and a gate of the driving transistor ~S610

Forming an interlayer dielectric layer, the active layer, the gate insulating layer and the gate layer being all located between the interlayer dielectric layer and the base substrate ~S620

Forming a first lead layer at the side of the interlayer dielectric layer away from the base substrate, the first lead layer being formed with a source electrode and a drain electrode ~S630

FIG. 23

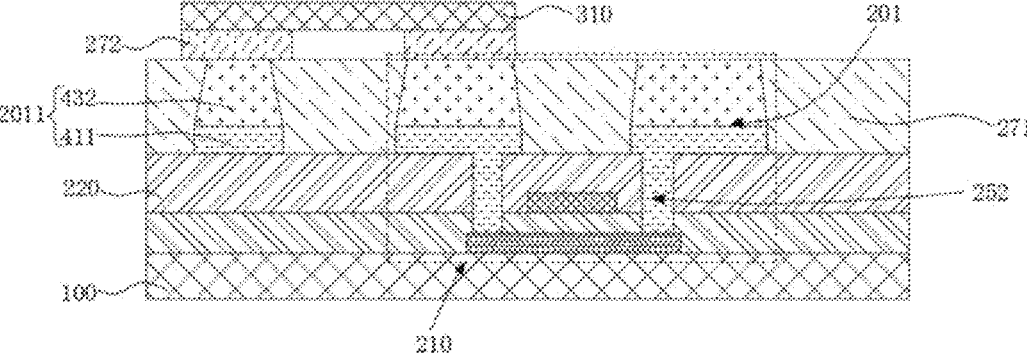

ARRAY SUBSTRATE AND PREPARATION METHOD THEREFOR, AND DISPLAY APPARATUS

CROSS-REFERENCE TO RELATED APPLICATIONS

The present disclosure is based upon International Application No. PCT/CN2021/093904 filed on May 14, 2021, which claims priority to Chinese Patent Application No. 202010461246.4, entitle "Array Substrate and Manufacturing Method thereof" filed on May 27, 2020, the entire contents thereof are incorporated herein by reference.

TECHNICAL FIELD

The present disclosure relates to the field of display technology, in particular, to an array substrate and manufacturing method thereof, and a display device.

BACKGROUND

For medium and large sized self-illuminating panels, such as medium and large-sized Micro LED display panels, medium and large sized Mini LED backlights or display panels, a long distance of a metal lead may lead to a serious voltage drop across the metal lead, and thus it is difficult to guarantee that a sufficient driving current may be provided for each current-driven light-emitting device. In the related art, a seed lead may be formed on a base substrate, and then a copper growth layer may be formed on the seed lead by a copper electroplating process, thereby manufacturing a metal lead with a relatively large thickness that can reduce a voltage drop across the metal lead. However, such method is only suitable for manufacturing a thick copper metal lead directly on the base substrate, which greatly limits the application thereof. Further, such method is difficult to precisely control the morphology and thickness uniformity of the metal lead manufactured, which is not conducive to uniformity of product property.

The above information disclosed in the Background section is only for enhancement of understanding of the background of the present disclosure and therefore it may contain information that does not form the prior art that is already known to a person skilled in the art.

SUMMARY

The present disclosure is to provide an array substrate and manufacturing method thereof, and a display device.

A first aspect of the present disclosure provides a method for manufacturing an array substrate, including:

providing a base substrate;

forming a driving circuit layer at a side of the base substrate; and forming a functional device layer at a side of the driving circuit layer away from the base substrate, forming the driving circuit layer at the side of the base substrate includes: forming at least one first lead layer at the side of the base substrate, forming any one of the first lead layer includes:

forming a conductive seed layer at the side of the base substrate;

forming a removable pattern-defining layer on a surface of the conductive seed layer away from the base substrate, the removable pattern-defining layer being provided with a lead opening, and the lead opening exposing a part of the conductive seed layer;

forming, in the lead opening, a metal plating layer on the surface of the conductive seed layer by using an electroplating process or a chemical plating process;

removing the removable pattern-defining layer; and removing a part of the conductive seed layer not covered by the metal plating layer.

In an exemplary embodiment of the present disclosure, forming the removable pattern-defining layer on the surface of the conductive seed layer away from the base substrate includes:

forming a removable insulating material layer on the surface of the conductive seed layer away from the base substrate; and forming the removable pattern defining layer by performing a patterning operation on the removable insulating material layer.

In an exemplary embodiment of the present disclosure, forming the removable insulating material layer on the surface of the conductive seed layer away from the base substrate includes:

forming a photoresist material layer on the surface of the conductive seed layer away from the base substrate, and forming the removable pattern defining layer by performing the patterning operation on the removable insulating material layer includes:

forming the removable pattern defining layer by exposing and developing the photoresist material layer.

In an exemplary embodiment of the present disclosure, forming the photoresist material layer on the surface of the conductive seed layer away from the base substrate includes:

forming the photoresist material layer on the surface of the conductive seed layer away from the base substrate by using a degradable photoresist material, the degradable photoresist material after curing being dissolvable in a degradation liquid, and removing the removable pattern-defining layer includes:

dissolving the removable pattern-defining layer by using the degradation liquid.

In an exemplary embodiment of the present disclosure, forming the photoresist material layer on the surface of the conductive seed layer away from the base substrate includes:

forming the photoresist material layer on the surface of the conductive seed layer away from the base substrate by using a negative photoresist material, forming the removable pattern defining layer by exposing and developing the photoresist material layer includes:

forming the removable pattern defining layer with the lead opening by exposing and developing the photoresist material layer so that a width of an end of the lead opening close to the base substrate is greater than a width of an end of the lead opening away from the base substrate.

In an exemplary embodiment of the present disclosure, forming the removable pattern-defining layer on the surface of the conductive seed layer away from the base substrate includes:

forming the removable pattern-defining layer on the surface of the conductive seed layer away from the base substrate, so that a minimum value of a width of the lead opening is a first dimension value, forming, in the lead opening, the metal plating layer on the surface of the conductive seed layer by using the electroplating process or the chemical plating process includes:

forming, in the lead opening, the metal plating layer on the surface of the conductive seed layer by using the electroplating process, so that a thickness of the metal plating layer is a second dimension value not greater than five times the first dimension value.

In an exemplary embodiment of the present disclosure, forming the at least one first lead layer at the side of the base substrate includes:

forming one first lead layer at the side of the base substrate;

forming a first planarization layer at a side of the one first lead layer away from the base substrate, the first planarization layer exposing at least part of the one first lead layer;

forming a first transition metal layer at a side of the first planarization layer away from the base substrate, the first transition metal layer being connected to the one first lead layer;

forming a second planarization layer at a side of the first transition metal layer away from the base substrate, the second planarization layer having a first connection via hole, the first connection via hole exposing a part of the first transition metal layer, and an orthographic projection of the first connection via hole on the one first lead layer not overlapping with the one first lead layer; and forming another first lead layer on a surface of the second planarization layer away from the base substrate, the another first lead layer being connected to the first transition metal layer through the first connection via hole.

A second aspect of the present disclosure provides an array substrate, including a base substrate, a driving circuit layer and a functional device layer that are stacked in sequence, the driving circuit layer includes at least one first lead layer, and any one of the first lead layer includes at least one first lead, any one of the first lead includes a seed lead provided at a side of the base substrate and a growth lead provided on a surface of the seed lead away from the base substrate, and an orthographic projection of the growth lead on the base substrate coincides with an orthographic projection of the seed lead on the base substrate.

In an exemplary embodiment of the present disclosure, a thickness of the first lead is not greater than five times a width of the seed lead.

In an exemplary embodiment of the present disclosure, a width of an end of the first lead away from the base substrate is smaller than a width of an end of the first lead close to the base substrate.

In an exemplary embodiment of the present disclosure, the driving circuit layer includes:

one first lead layer, provided at a side of the base substrate;

a first planarization layer, provided at a side of the one first lead layer away from the base substrate;

a first transition metal layer, provided at a side of the first planarization layer away from the base substrate and connected to the one first lead layer;

a second planarization layer, provided at a side of the first transition metal layer away from the base substrate and provided with a first connection via hole, the first connection via hole exposing a part of the first transition metal layer, and an orthographic projection of the first connection via hole on the one first lead layer not overlapping with the one first lead layer;

another first lead layer, provided on a surface of the second planarization layer away from the base substrate and connected to the first transition metal layer through the first connection via hole.

In an exemplary embodiment of the present disclosure, the driving circuit layer includes:

a driving transistor, provided at the side of the base substrate, and including a source-drain metal layer having a source electrode and a drain electrode;

a third planarization layer, provided at a side of the driving transistor away from the base substrate, and provided with a third connection via hole exposing at least part of the source-drain metal layer;

a second transition metal layer, provided at a side of the third planarization layer away from the base substrate, and connected to the source-drain metal layer through the third connection via hole;

a fourth planarization layer, provided at a side of the second transition metal layer away from the base substrate, and having a fourth connection via hole, the fourth connection via hole exposing a part of the second transition metal layer, and an orthographic projection of the fourth connection via hole on the base substrate not overlapping with an orthographic projection of the third connection via hole on the base substrate; and one first lead layer, provided on a surface of the fourth planarization layer away from the base substrate, and connected to the second transition metal layer through the fourth connection via hole.

In an exemplary embodiment of the present disclosure, the driving circuit layer includes:

a driving transistor, provided at a side of the base substrate, and including a source-drain metal layer having a source electrode and a drain electrode;

a third planarization layer, provided at a side of the source-drain metal layer away from the base substrate, and provided with a third connection via hole exposing at least part of the source-drain metal layer, an orthographic projection of the third connection via hole on the base substrate not overlapping with an orthographic projection of the second connection via hole on the base substrate; and one first lead layer, provided on a surface of the third planarization layer away from the base substrate, and connected to the source-drain electrode layer through the third connection via hole.

In an exemplary embodiment of the present disclosure, the driving circuit layer includes a driving transistor, and the driving transistor includes:

a semiconductor layer, provided at the side of the base substrate, and including a source contact region and a drain contact region;

an interlayer dielectric layer, provided at a side of the semiconductor layer away from the base substrate; and one first lead layer, provided at a side of the interlayer dielectric layer away from the base substrate, and formed with a source electrode and a drain electrode, the source electrode being connected to the source contact region, and the drain electrode being connected to the drain contact region.

A third aspect of the present disclosure provides a display device including the above array substrate.

BRIEF DESCRIPTION OF THE DRAWINGS

The above and other features and advantages of the present disclosure will become more apparent from the detailed description of example embodiments thereof with reference to the accompanying drawings.

FIG. 3 is a schematic flowchart of forming any first lead layer according to an embodiment of the present disclosure.

FIG. 4 is a schematic structural diagram of providing a base substrate according to an embodiment of the present disclosure.

FIG. 5 is a schematic structural diagram of forming a conductive seed layer at a side of a base substrate according to an embodiment of the present disclosure.

FIGS. 6-1 and 6-2 are schematic structural diagrams of forming a removable pattern-defining layer on a surface of a conductive seed layer away from a base substrate according to an embodiment of the present disclosure.

FIG. 11 is a schematic flowchart of forming a group of first lead layers according to an embodiment of the present disclosure.

FIG. 12 is a schematic structural diagram of forming a first planarization layer at a side of a previous first lead layer away from a base substrate according to an embodiment of the present disclosure.

FIG. 19 is a schematic flowchart of forming a first lead layer electrically connected to a driving transistor according to an embodiment of the present disclosure.

FIG. 20 is a schematic structural diagram of an array substrate according to an embodiment of the present disclosure.

FIG. 21 is a schematic flowchart of forming a first lead layer electrically connected to a driving transistor according to an embodiment of the present disclosure.

FIG. 22 is a schematic structural diagram of an array substrate according to an embodiment of the present disclosure.

FIG. 23 is a schematic flowchart of forming a first lead layer electrically connected to a driving transistor according to an embodiment of the present disclosure.

FIG. 24 is a schematic structural diagram of an array substrate according to an embodiment of the present disclosure.

Figure 1:
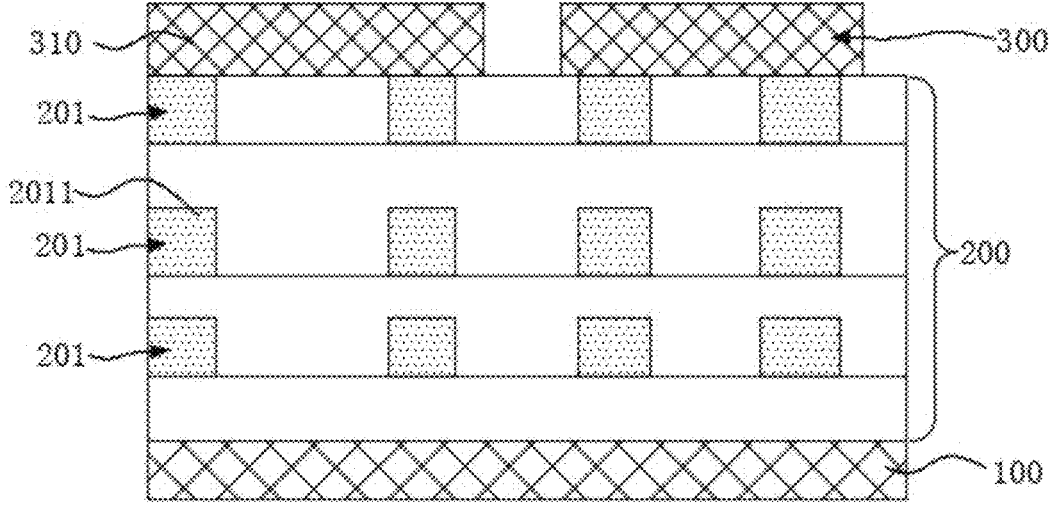
FIG. 1 is a schematic structural diagram of an array substrate according to an embodiment of the present disclosure.

Illustrations of main components in the drawings:

100, base substrate; 110, alignment mark layer; 111, alignment pattern; 120, buffer layer; 200, driving circuit layer; 201, first lead layer; 201*a*, previous first lead layer; 201*b*, later first lead layer; 2011, first lead; 202, second lead layer; 210, driving transistor; 220, interlayer dielectric layer; 230, source-drain metal layer; 241, first planarization layer; 242, second planarization layer; 243, third planarization layer; 244, fourth planarization layer; 251, first connection via hole; 252, second connection via hole; 253, third connection via hole; 254, fourth connection via hole; 261, first transition metal layer; 262, second transition metal layer; 271, pixel definition layer; 272, conductive adhesive; 300, functional device layer; 310, functional device; 311, LED; 410, conductive seed layer; 411, seed lead; 420, removable pattern-defining layer; 421, lead opening; 430, metal plating layer; 431, precursor growth lead; 432, growth lead; 440, passivation layer; 510, scanning lead; 520, data lead; 530, common voltage lead; 540, bonding lead; 610, backside lead layer; 620, insulating layer; 630, bonding pad layer; 710, first metal wiring layer; 720, second metal wiring layer; 711, first metal lead; 721, second metal lead.

DETAILED DESCRIPTION

Example embodiments will now be described more fully with reference to the accompanying drawings. Example embodiments, however, may be embodied in various forms and should not be construed as limited to the examples set forth herein; rather, these embodiments are provided so that the present disclosure will be thorough and complete, and the concept of example embodiments would be fully conveyed to those skilled in the art. The described features, structures, or characteristics may be combined in any suitable manner in one or more embodiments. In the following description, numerous specific details are provided in order to give a thorough understanding of the embodiments of the present disclosure.

In the figures, the thickness of regions and layers may be exaggerated for clarity. The same reference numerals in the drawings denote the same or similar structures, and thus their detailed descriptions will be omitted.

The described features, structures, or characteristics may be combined in any suitable manner in one or more embodiments. In the following description, numerous specific details are provided in order to give a thorough understanding of the embodiments of the present disclosure. However, a person skilled in the art will appreciate that the technical solution of the present disclosure may be practiced without one or more of the specific details, or with other methods, components, materials and the like. In other instances, well-known structures, materials, or operations are not shown or described in detail to avoid obscuring the main technical idea of the present disclosure.

When a certain structure is "on" another structure, it may mean that the certain structure is integrally formed on said another structure, or that the certain structure is "directly" arranged on said another structure, or that the certain structure is "indirectly" arranged on said another structure through an additional structure.

The terms "a", "an", "the" are used to indicate the presence of one or more elements/components/etc.; the terms "including" and "having" are used to indicate an open-ended inclusive meaning and that additional elements/components/etc. may be present in addition to the listed elements/components/etc. The terms "first" and "second" and the like are used only as labels and are not intended to limit the number of the objects thereof.

In the present disclosure, a width of a lead refers to a dimension of the lead in a direction perpendicular to an extending direction thereof in a plane parallel to a base substrate. A thickness of a film layer or lead refers to a dimension of the film layer or lead in a direction perpendicular to the base substrate.

In the related art, a seed lead may be formed on a base substrate, and then a copper growth layer may be formed on the seed lead by a copper electroplating process, therefore a thick electroplating metal lead is formed. However, when the copper electroplating process is performed on the seed lead, the copper growth layer would grow outward on the surface of the seed lead, and the shape and width thereof are not easy to be controlled. In some related technologies, a retaining wall structure may be arranged between the seed leads, and then the copper electroplating process is performed, so that the width of the copper growth layer may be constrained. However, there is an alignment error during the preparation of the retaining wall structure, therefore it is difficult to accurately embed the retaining wall between the seed leads, which restricts the improvement of the surface uniformity of the copper growth layer.

Figure 2:
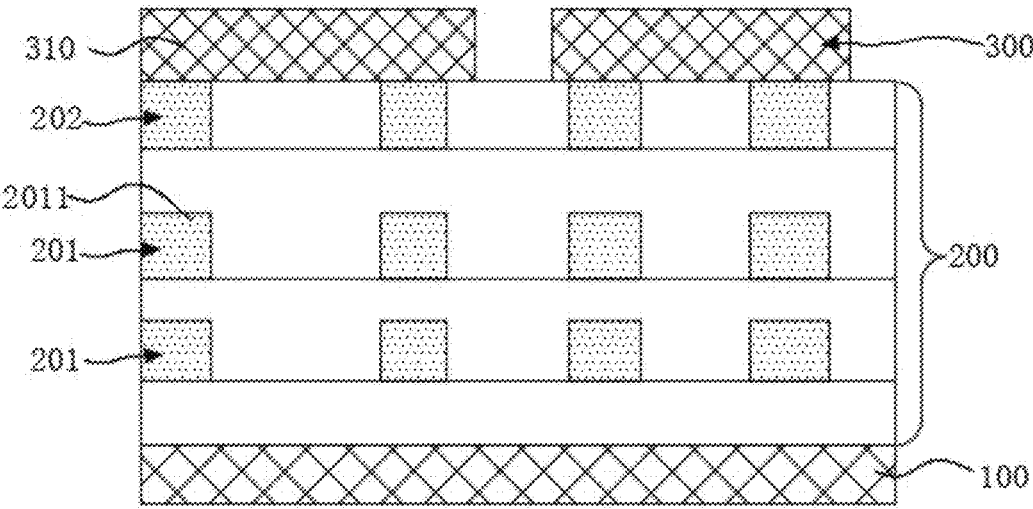
FIG. 2 is a schematic structural diagram of an array substrate according to an embodiment of the present disclosure.

The present disclosure provides a method for manufacturing an array substrate. As shown in FIGS. 1 and 2, the array substrate includes a base substrate 100, a driving circuit layer 200 and a functional device layer 300 that are stacked in sequence. The method for manufacturing the array substrate includes:

step S110, providing a base substrate, as shown in FIG. 4;

step S120, forming a driving circuit layer 200 at a side of the base substrate 100;

step S130, forming a functional device layer 300 at a side of the driving circuit layer 200 away from the base substrate 100.

Figures 1, 6:
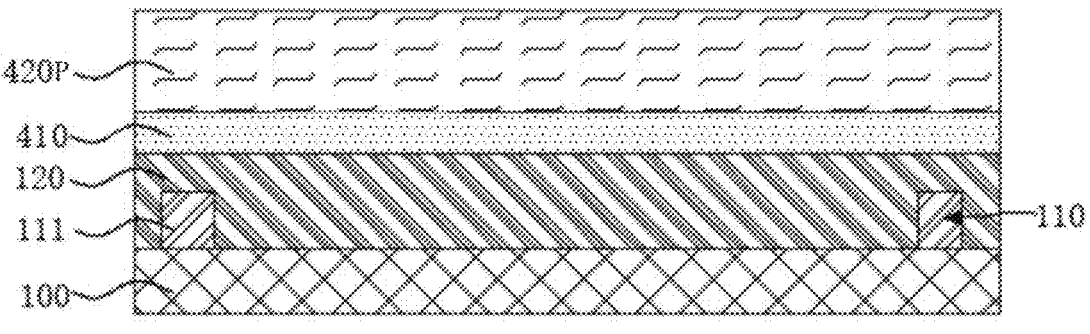
Figures 2, 6:
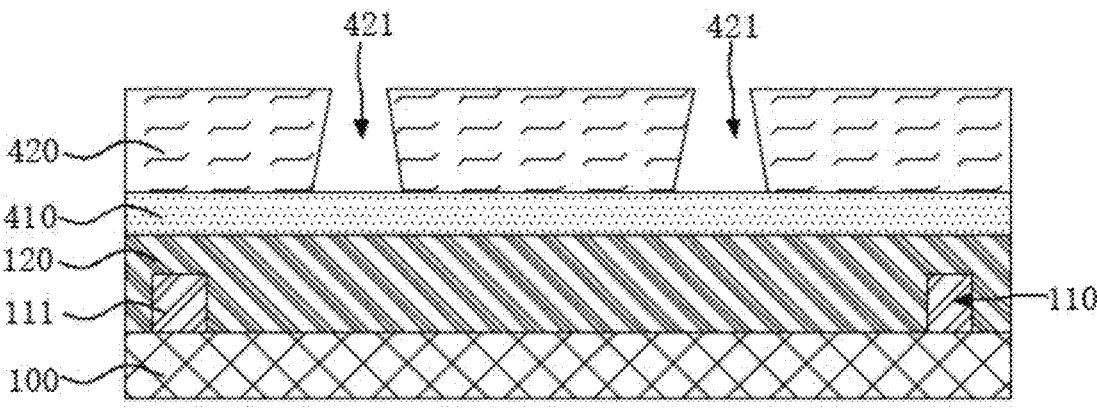
Figure 7:
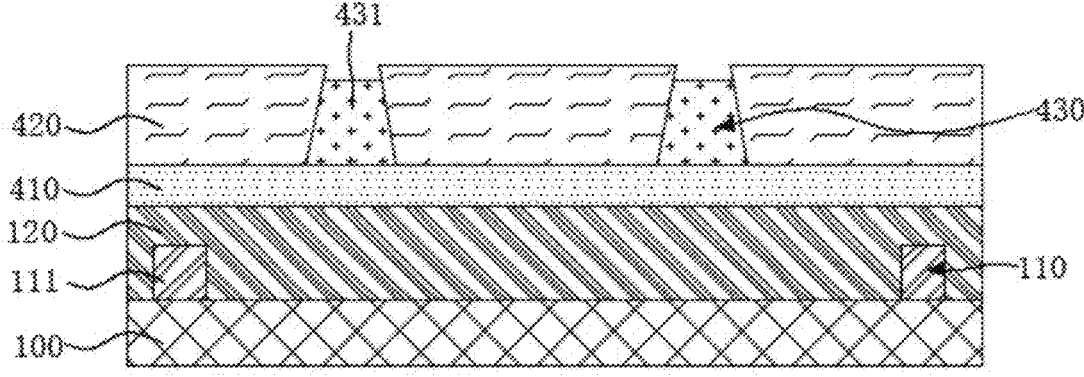
FIG. 7 is a schematic structural diagram of forming, in a lead opening, a metal plating layer on a surface of a conductive seed layer by an electroplating process according to an embodiment of the present disclosure.
Figure 8:
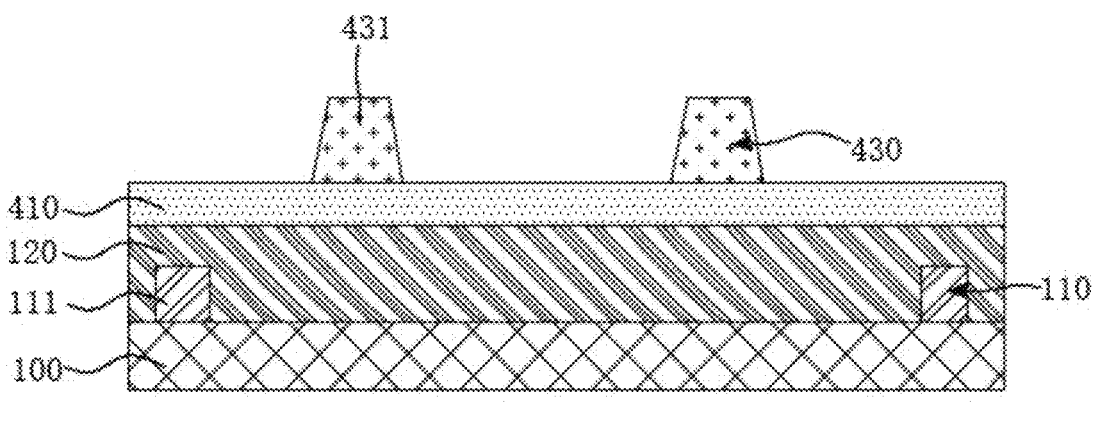
FIG. 8 is a schematic structural diagram of removing a removable pattern-defining layer according to an embodiment of the present disclosure.
Figure 9:
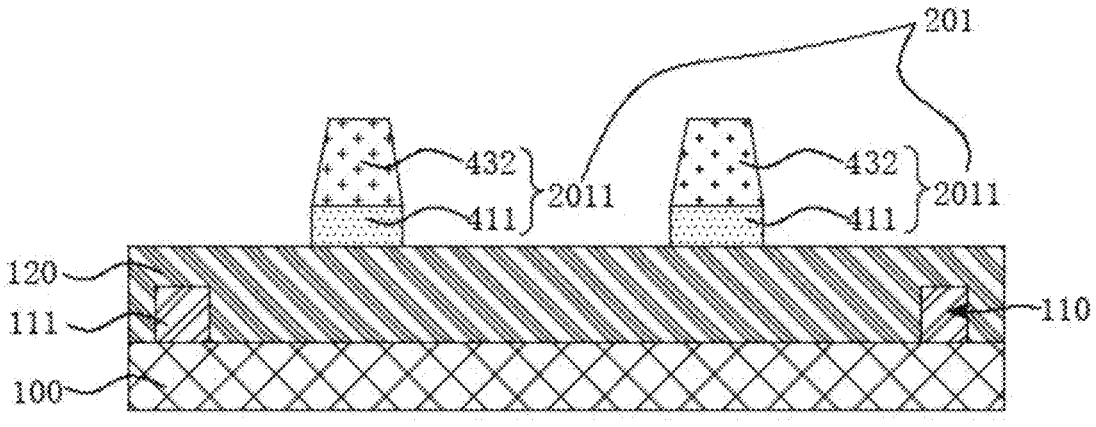
FIG. 9 is a schematic structural diagram of forming a first lead layer by etching according to an embodiment of the present disclosure.

Forming the driving circuit layer 200 at the side of the base substrate 100 includes: forming at least one first lead layer 201 at the side of the base substrate 100. As shown in FIG. 3, forming any one of the first lead layer 201 includes:

step S210, forming a conductive seed layer 410 at the side of the base substrate 100, as shown in FIG. 5;

step S220, forming a removable pattern-defining layer 420 on a surface of the conductive seed layer 410 away from the base substrate 100, the removable pattern-defining layer 420 being provided with a lead opening 421, and the lead opening 421 exposing a part of the conductive seed layer 410, as shown in FIG. 6-2;

step S230, forming, in the lead opening 421, a metal plating layer 430 on the surface of the conductive seed layer 410 by using an electroplating process or a chemical plating process, as shown in FIG. 7;

step S240, removing the removable pattern-defining layer 420, as shown in FIG. 8; and step S250, removing a part of the conductive seed layer 410 not covered by the metal plating layer 430 so that the first lead layer 201 is formed, as shown in FIG. 9.

According to the method for manufacturing the array substrate provided by the present disclosure, the entire conductive seed layer 410 and the removable pattern-defining layer 420 covering the conductive seed layer 410 may be formed first. The conductive seed layer 410 is not patterned, which may ensure that the conductive seed layer 410 would not be missing in the lead opening 421, and overcome the problem that the electroplating base or the chemical plating base may be missing in a part of the lead opening 421. Then, a metal is grown in the lead opening 421 by the electroplating process or the chemical plating process to prepare a precursor growth lead 431 in the lead opening 421, and thus the metal plating layer 430 is formed. During the electroplating or chemical plating process, the removable pattern-defining layer 420 may define the side of the precursor growth lead 431 so that the precursor growth lead 431 has a good side morphology. The conductive seed layer 410 in the lead opening 421 may provide a complete electroplating base or chemical plating base, so that the surface of the precursor growth lead 431 away from the base substrate 100 has a good uniformity. Then, the removable pattern-defining layer 420 is removed and the conductive seed layer 410 is patterned by etching to form the seed lead 411 covered by the precursor growth lead 431. The precursor growth lead 431 may also be partially etched during the etching process to form the growth lead 432, and the uniformity of the surface of the growth lead 432 away from the base substrate 100 may be further improved by utilizing the difference in etching speed at different positions during the etching process. Therefore, the first lead layer 201 includes a first lead 2011, and the first lead 2011 includes the seed lead 411 and the growth lead 432 stacked on the surface of the seed lead 411. The first lead 2011 has a good surface uniformity, and the performance of the array substrate may be improved. Further, the method for manufacturing the array substrate provided by the present disclosure overcomes the limitation of the process in the related art on the film layer position of the electroplated metal lead, and the first lead layer 201 may be formed at a desired position according to the performance requirement of the array substrate, which further ensures that the functional device 310 of the functional device layer 300 obtains sufficient driving current.

The steps, principles and effects of the method for manufacturing the array substrate provided by the present disclosure will be further explained and described below with reference to the accompanying drawings.

In step S110, the base substrate 100 of the array substrate may be provided. The base substrate 100 may include inorganic material or organic material. For example, in an embodiment of the present disclosure, the material of the base substrate 100 may be glass materials such as soda-lime glass, quartz glass, sapphire glass and the like, or may be metal materials such as stainless steel, aluminum, nickel and the like. In another embodiment of the present disclosure, the material of the base substrate 100 may be polymethyl methacrylate (PMMA), polyvinyl alcohol (PVA), polyvinyl phenol (PVP), polyether sulfone (PES), polyimide, polyamide, polyacetal, polycarbonate (PC), polyethylene terephthalate (PET), polyethylene naphthalate (PEN) or a combination thereof. In another embodiment of the present disclosure, the base substrate 100 may also be a flexible base substrate 100, for example, the material of the base substrate 100 may be polyimide (PI). The base substrate 100 may also be a composite of multi-layer materials. For example, in an embodiment of the present disclosure, the base substrate 100 may include a bottom film layer, a pressure-sensitive adhesive layer, a first polyimide layer and a second polyimide layer which are stacked in sequence.

In step S120, the driving circuit layer 200 may be formed at the side of the base substrate 100. The driving circuit layer 200 is used to drive each functional device 310 in the functional device layer 300. The driving circuit layer 200 includes a driving circuit including at least one metal wiring layer, and any metal wiring layer includes at least one metal lead. At least one metal wiring layer is the first lead layer 201 of the present disclosure.

It may be understood that, as shown in FIGS. 1 and 2, all the metal wiring layer in the driving circuit layer 200 may be the first lead layer 201, or a part of the metal wiring layer may be the first lead layer 201. For example, as shown in FIG. 2, in the driving circuit layer 200, a part of the metal wiring layer may be the first lead layer 201, and another part of the metal wiring layer may be a second lead layer 202. The second lead layer 202 may be prepared by forming a metal film layer by a deposition process and patterning the metal film layer. In other words, the second lead layer 202 may be formed not by using the electroplating process or chemical plating process, and each second lead of the second lead layer 202 may have a lower thickness. In some embodiments, the material of the second lead layer 202 may be the same as or different from the conductive seed layer 410. For example, one or more of the following metal wiring layers in the driving circuit layer 200 may be the second lead layer 202: a gate lead layer, a source-drain lead layer, a metal transition layer, a light shielding layer, an electrode layer, a bonding layer or the like. Of course, any one of the above film layers may also be prepared into the first lead layer 201 by means of the electroplating process or chemical plating process. When a certain metal wiring layer in the driving circuit layer 200 is the first lead layer 201, the first lead layer 201 may be prepared according to the manufacturing method shown in steps S210 to S250, so that any one of the first leads 2011 may include the seed lead 411 and the growth lead 432 stacked on the surface of the seed lead 411 away from the base substrate 100.

In some embodiments of the present disclosure, the driving circuit layer 200 may include a passive driving circuit, for example, the driving circuit layer 200 includes a driving circuit including at least one metal wiring layer, and any one metal wiring layer includes at least one metal lead.

Figure 26:
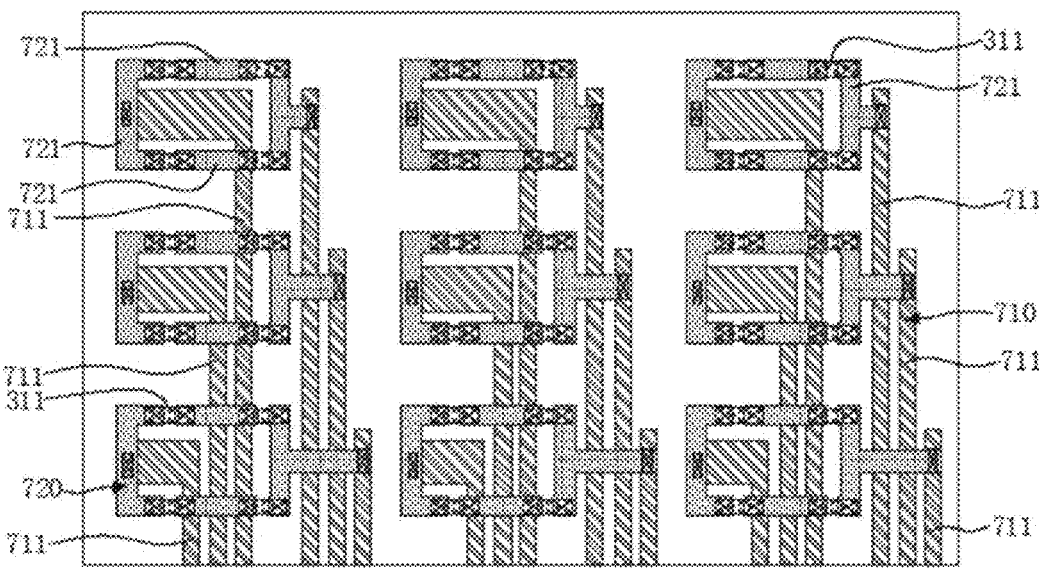
FIG. 26 is a schematic top-view structural diagram of an array substrate according to an embodiment of the present disclosure.

As an example, the present disclosure provides an array substrate with a passive driving circuit to explain and illustrate the structure and principle of the array substrate of the present disclosure. FIG. 26 only shows a first metal wiring layer 710, a second metal wiring layer 720 and a functional device layer of the array substrate. In the example, the array substrate includes a base substrate 100, a driving circuit layer 200 and a functional device layer 300 that are stacked in sequence. The driving circuit layer 200 includes the first metal wiring layer 710, an insulating layer and the second metal wiring layer 720 stacked on the base substrate 100. The first metal wiring layer 710 includes a plurality of first metal leads 711; the insulating layer is provided with a connection via hole exposing a part of the first metal lead layer 711; the second metal lead layer 721 includes a plurality of second metal leads 721, and the second metal lead 721 may be used as the electrode layer of the driving circuit for binding with the functional device 310. A part of the second metal leads 721 are electrically connected to the first metal leads 711 through the connection via holes. The functional device layer 300 includes functional devices 310 arranged in an array, and the functional device 310 may be an LED 311. An end of the LED 311 is connected to one second metal lead 721 through solder paste, and the other end thereof is connected to another second metal lead 721 through solder paste.

In the example, the first metal wiring layer 710 may adopt the structure of the first wiring layer 201 in the embodiment of the present disclosure, so as to ensure that a sufficient amount of current may be transmitted to the second metal wiring layer 720, and to avoid an obvious voltage drop during the driving process. The second metal wiring layer 720 may adopt the structure of the first lead layer 201 of the present disclosure, or may adopt the structure of the second lead layer 202 of the present disclosure, which is not limited in the present disclosure.

Further, the array substrate may include a plurality of light-emitting regions, and four second metal leads 721 may be arranged in each light-emitting region and are adjacent to each other in an end to end way. Two second metal leads 721 arranged opposite to each other are respectively connected to two different first metal leads 711 through the connection via holes. The other two second metal leads 721 are not electrically connected to the first metal leads 711. One LED 311 is disposed at a position where two second metal leads 721 are adjacent to each other, and two ends of the LED 311 are respectively connected to the two second metal leads 721. In this way, when a common voltage and a driving voltage are respectively applied to the two first metal leads 711, four LEDs 311 may be driven to emit light.

It may be understood that the exemplary array substrate may be used not only as a backlight source of an LCD display device, but also as a passively driven display panel, which is not specifically limited in the present disclosure. The LED 311 may be an LED lamp bead, or may be a Micro LED or a Mini LED.

In some other embodiments of the present disclosure, the driving circuit layer 200 may include an active driving circuit. For example, the driving circuit layer 200 of the array substrate may also be provided with electronic elements such as driving transistors. Each electronic element is electrically connected to the device layer 300 through at least one metal wiring layer. Each metal wiring layer includes at least one metal lead. The at least one metal wiring layer is the first lead layer 201 of the present disclosure. Of course, according to the requirements of the array substrate, the driving circuit layer 200 may also be provided with other electronic elements, for example, other required transistors in addition to storage capacitors and driving transistors.

In an embodiment, the transistor may be a thin film transistor (TFT) or a metal oxide semiconductor field effect transistor (MOS). By taking the transistor as the thin film transistor, in terms of a film structure, the thin film transistor may be a top-gate thin film transistor or a bottom-gate thin film transistor, which is not limited in the present disclosure. In terms of a thin film transistor material, the thin film transistor may be an amorphous silicon thin film transistor, a low temperature polysilicon thin film transistor or an oxide thin film transistor, which is not limited in the present disclosure. In terms of a conduction condition of the thin film transistor, the thin film transistor may be an N-type thin film transistor or a P-type thin film transistor, which is not limited in the present disclosure. In the driving circuit layer 200, each of the thin film transistor and storage capacitor may be formed by film layers such as an active layer, a gate insulating layer, a gate layer, an interlayer dielectric layer, and a source-drain metal layer. The thin film transistor may include a semiconductor layer in an active layer, a gate insulating layer, a gate in a gate layer, an interlayer dielectric layer, and a source-drain electrode layer in a source-drain metal layer. The source-drain electrode layer includes a source electrode and a drain electrode of the thin film transistor. The semiconductor layer includes a channel region and a source contact region and a drain contact region on both sides of the channel region. The source electrode passes through the interlayer dielectric layer to connect with the source contact region, and the drain electrode passes through the interlayer dielectric layer to connect with the drain electrode. The gate and the channel region are isolated by the gate insulating layer. The positional relationship of respective film layers may be determined according to the film layer structure of the thin film transistor. For example, the driving circuit layer 200 may include an active layer, a gate insulating layer, a gate layer, an interlayer dielectric layer, and a source-drain metal layer that are stacked in sequence, and the thin film transistor thus formed is a top-gate thin film transistor. For another example, the driving circuit layer 200 may include a gate layer, a gate insulating layer, an active layer, an interlayer dielectric layer, and a source-drain metal layer that are stacked in sequence, and the thin film transistor thus formed is a bottom-gate thin film transistor. The driving circuit layer 200 may also have a double gate structure, that is, the gate layer may include a first gate layer and a second gate layer, and the gate insulating layer may include a first gate insulating layer for isolating the active layer and the first gate layer and a second gate insulating layer for isolating the first gate layer and the second gate layer. For example, the driving circuit layer 200 may include an active layer, a first gate insulating layer, a first gate layer, a second gate insulating layer, a second gate layer, an interlayer dielectric layer and a source-drain metal layer which are sequentially stacked at a side of the base substrate 100.

Figure 27:
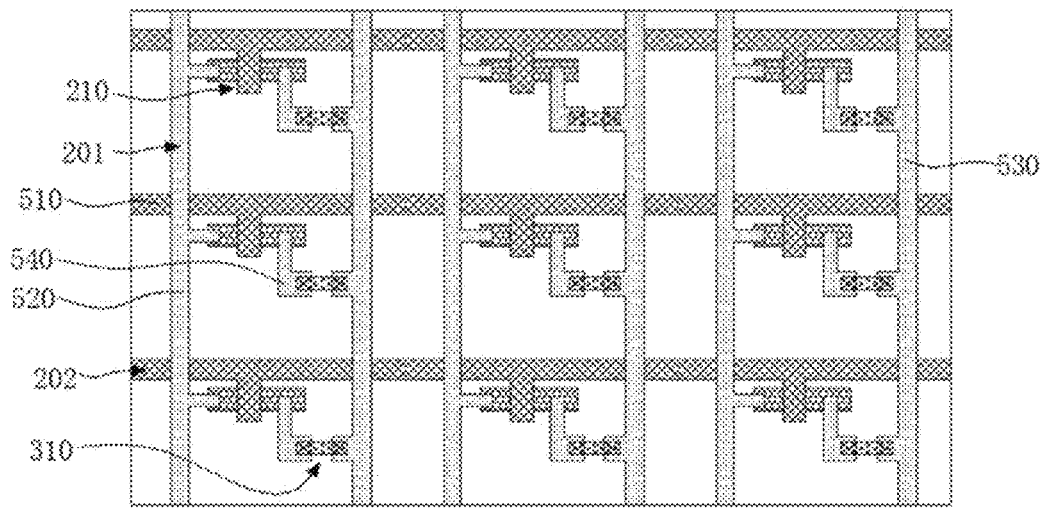
FIG. 27 is a schematic top-view structural diagram of an array substrate according to an embodiment of the present disclosure.

As an example, as shown in FIG. 27, the present disclosure provides an array substrate having an active driving circuit to explain and illustrate the structure and principle of the array substrate of the present disclosure. FIG. 27 shows only driving transistors, two layers of metal wiring layers, and LEDs as functional devices of the array substrate. In this example, the driving circuit is a semi-active driving circuit, which includes a driving transistor 210, a scan lead 510, a data lead 520, a common voltage lead 530 and a binding lead 540. The scan lead 510 is used to control the driving transistor 210 to be turned on or off, the data lead 520 is connected to the source of the driving transistor 210, the binding lead is connected to the drain of the driving transistor 210, and both ends of the LED as the functional device 310 are connected to the binding lead 540 and the common voltage lead 530 respectively. When a valid scan signal is applied to the scan lead 510 to turn on the driving transistor 210, a drive current may flow through the LED through the data lead 520, the driving transistor 210, the binding lead and the common voltage lead 530, so that the LED emits light. In this example, the scan lead 510 may belong to the second lead layer 202, and each scan lead 510 does not need to be prepared by an electroplating process or a chemical plating process. The data lead 520, the common voltage lead 530 and the binding lead 540 belong to the same first lead layer 201, and may be formed by the electroplating process or chemical plating process to increase the thickness of each lead and reduce the impedance of each lead, so as to reduce the voltage drop of the driving circuit across the data lead 520 and the common voltage lead 530 and ensure the accuracy of the current flowing through the LEDs.

When preparing the driving circuit layer 200, any of the first lead layers 201 may be prepared according to the manufacturing method shown in steps S210 to S250.

In step S210, as shown in FIG. 5, a metal material may be deposited at a side of the base substrate 100 to form the conductive seed layer 410. For example, a magnetron sputtering method may be used to deposit a metal material at the side of the base substrate 100 to form the conductive seed layer 410 as an electroplating base or a chemical plating base. It may be understood that, in the present disclosure, if the metal plating layer 430 is prepared by the electroplating process in step S230, the conductive seed layer 410 prepared in step S210 may be used as the electroplating base. In the present disclosure, if the metal plating layer 430 is prepared by the chemical plating process in step S230, the conductive seed layer 410 prepared in step S210 may be used as the chemical plating base.

It may be understood that, before depositing the metal material, an intermediate substrate may be obtained according to the process steps that have been performed. According to different process steps that have been performed, the intermediate substrate may have different structures, for example, may be the base substrate 100 itself, or may include the base substrate 100 and various already formed film layers sequentially stacked on the base substrate 100. In step S210, a metal material may be deposited on the surface of the intermediate substrate on which the conductive seed layer 410 is to be formed. For example, in an embodiment of the present disclosure, if the first lead layer 201 needs to be formed on the surface of the base substrate 100, the base substrate 100 is used as the intermediate substrate in this step, and the metal material is deposited on the surface of the base substrate 100. For another example, in another embodiment of the present disclosure, if there is a film layer structure between the to-be-formed first lead layer 201 and the base substrate 100, when preparing the first lead 2011, the base substrate 100 and the film layer structure as a whole are used as the intermediate substrate in this step, and the surface of the film layer structure away from the base substrate 100 is the surface on which the conductive seed layer 410 is to be formed.

In an embodiment, the thickness of the conductive seed layer 410 may be not greater than 1 μm, so as to avoid excessive stress on the intermediate substrate caused by the excessively thick conductive seed layer 410 and improve the stability and yield of the array substrate. In an embodiment, the thickness of the conductive seed layer 410 may be not greater than 0.5 μm, so as to shorten the etching time of the conductive seed layer 410 in step S250 and improve the side morphology of the seed lead 411 formed after etching.

The conductive seed layer 410 may be a metal material, an alloy formed of multiple metal materials, or multiple stacked metal layers, which are not limited in the present disclosure as long as the requirements of the electroplating process or chemical plating process and the performance requirements of the array substrate may be met.

In an embodiment, the conductive seed layer 410 may include a protective metal layer and a target metal layer located on a surface of the protective metal layer away from the base substrate 100. The target metal layer may be used as an electroplating base or a chemical plating base to form the metal plating layer 430 on the surface of the target metal layer away from the base substrate 100. For example, when the electroplating process or chemical plating process is a copper plating process, the material of the target metal layer may be copper.

The protective metal layer is used to protect the target metal layer from being corroded, or to protect the intermediate substrate from being corroded by the metal material of the target metal layer. The material of the protective metal layer may be a metal element or an alloy, for example, molybdenum, titanium, molybdenum-titanium-nickel alloy and the like.

In an embodiment of the present disclosure, the conductive seed layer 410 includes a protective metal layer and a target metal layer sequentially stacked at the side of the base substrate 100. The material of the protective metal layer may be MTD alloy (molybdenum-titanium-nickel alloy) with a thickness of 250-350 angstroms; and the material of the target metal layer may be copper with a thickness of 2500-3500 angstroms.

It can be understood that when preparing different first lead layers 201, the types and thicknesses of the metal materials deposited in step S210 may be the same or different, so that the structures and materials of the seed leads 411 of different first lead layers 201 are the same or different.

In step S220, as shown in FIG. 6-2, the removable pattern-defining layer 420 may be formed on the surface of the conductive seed layer 410 away from the base substrate 100, and the removable pattern-defining layer 420 may be provided with a lead opening 421. The lead opening 421 may expose a portion of the conductive seed layer 410. In this way, during the electroplating process or the chemical plating process, the portion of the conductive seed layer 410 exposed by the lead opening 421 may be used as the electroplating base or the chemical plating base for growing an electroplating metal or a chemical plating metal, and the electroplating metal or the chemical plating metal cannot be grown on the portion of the conductive seed layer 410 covered by the removable pattern-defining layer 420. Therefore, an orthographic projection of the lead opening 421 on the base substrate 100 may coincide with an orthographic projection of the metal plating layer 430 formed in step S230.

In an embodiment, the removable pattern-defining layer 420 may be prepared through steps S221 and S222.

In step S221, a removable insulating material layer 420P is on the surface of the conductive seed layer 410 away from the base substrate 100, as shown in FIG. 6-1;

In step S222, the removable insulating material layer 420P is patterned to form the removable pattern-defining layer 420.

In an embodiment, in step S221, the removable insulating material layer 420P may be a photoresist material layer, that is, the photoresist material layer may be formed on the surface of the conductive seed layer 410 away from the base substrate 100. In this way, in step S222, the photoresist material layer may be patterned through exposure and development to form the removable pattern-defining layer 420.

In an embodiment of the present disclosure, in step S221, a degradable photoresist material may be used to form the photoresist material layer on the surface of the conductive seed layer 410 away from the base substrate 100. The degradable photoresist material is a photoresist material that can be dissolved in a degradation solution after curing.

In an embodiment, the degradable photoresist material has a decomposable crosslinking group or forms a decomposable crosslinking group upon curing. After the degradable photoresist material is cured, when the cured degradable photoresist material needs to be removed, the cured degradable photoresist material may be treated with a degradation solution. The decomposable crosslinking group in the cured degradable photoresist material may react with the degradation solution and then break, so that the cured degradable photoresist material is decomposed into small molecular fragments that can be dissolved in the degradation solution. In this way, a gentle and complete removal of the cured degradable photoresist material may be achieved.

In step S221, the photoresist material layer is prepared by using the degradable photoresist material, then the material of the removable pattern-defining layer 420 prepared in step S222 is a cured degradable photoresist material. In step S240, the removable pattern-defining layer 420 may be dissolved by using the degradation solution to realize the removal of the removable pattern-defining layer 420, which not only ensures the complete removal of the removable pattern-defining layer 420, but also avoids damaging the metal plating layer 430 when removing the removable pattern-defining layer 420.

Figure 10:
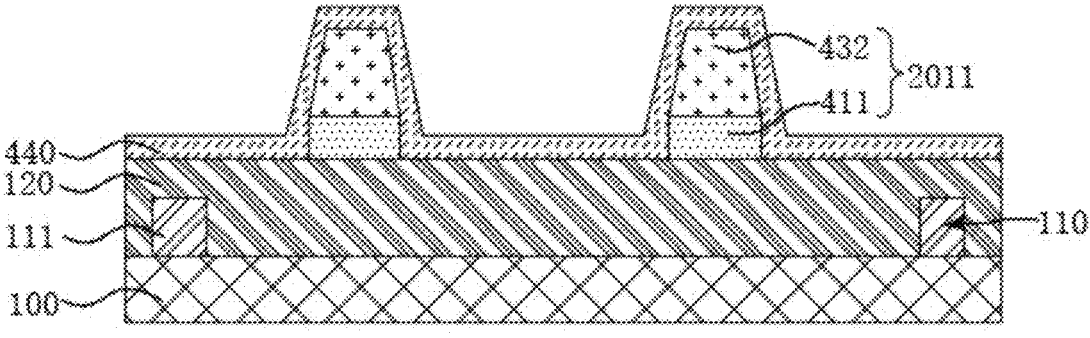
FIG. 10 is a schematic structural diagram of forming a passivation layer on a surface of a first lead layer away from a base substrate according to an embodiment of the present disclosure.

In another embodiment of the present disclosure, in step S221, a negative photoresist material may be used to form the photoresist material layer on the surface of the conductive seed layer 410 away from the base substrate 100. In this way, in step S222, the photoresist material layer is exposed and developed to form the removable pattern-defining layer 420 with the lead opening 421, so that a width of an end of the lead opening 421 close to the base substrate 100 is greater than a width of an end of the lead opening 421 away from the base substrate 100. In other words, the width of the lead opening 421 may be reduced in the direction away from the base substrate 100 by virtue of the material property of the negative photoresist material, which not only facilitates the removal of the removable pattern-defining layer 420, but also enables that the width of the growth lead 432 formed by the electroplating process or the chemical plating process is reduced in the direction away from the base substrate 100, thereby increasing the strength of the growth lead 432 and reducing the risk of collapse of the growth lead 432. In this way, in the prepared first lead 2011, the width of the end of the first lead 2011 away from the base substrate 100 is smaller than the width of the end of the first lead 2011 close to the base substrate 100. In a further embodiment, as shown in FIG. 10, a passivation material, such as silicon oxide, silicon nitride, silicon oxynitride, may also be deposited on the surface of the first lead 2011 away from the base substrate 100 and the side of the first lead 2011 to form a passivation layer 440 for protecting the first lead 2011. Since the width of the growth lead 432 formed by the electroplating process or the chemical plating process is reduced in the direction away from the base substrate 100, the continuity of the passivation layer may be ensured.

Of course, in other embodiments of the present disclosure, other removable insulating materials may also be used to prepare the removable pattern-defining layer 420, and in step S240, a corresponding process is used to remove the removable pattern-defining layer 420. For example, silicon oxide may be used to prepare the removable pattern-defining layer 420 and the removable pattern-defining layer 420 may be removed through an etching process, or a photosensitive resin may be used to prepare the removable pattern-defining layer 420 and a dry lift-off process may be used to remove the removable pattern-defining layer 420, which will be not described in further detail in the present disclosure.

In step S230, as shown in FIG. 7, the metal plating layer 430 on the surface of the conductive seed layer 410 may be formed in the lead opening 421 by an electroplating process or a chemical plating process. During the electroplating process or the chemical plating process, an electroplating metal or a chemical plating metal starts to grow from the surface of the conductive seed layer 410 serving as an electroplating base or a chemical plating base. Under the constraint of the lead opening 421, the electroplating metal only grows in the lead opening 421, and finally, after the electroplating process, a precursor growth lead 431 is formed in the lead opening 421, and respective precursor growth leads 431 form the metal plating layer 430. It can be understood that when the metal plating layer 430 is formed by the electroplating process, the metal grown on the surface of the conductive seed layer 410 is an electroplating metal, and the formed metal plating layer 430 may be used as the electroplating metal layer of the present disclosure. When the metal plating layer 430 is formed by the chemical plating process, the metal grown on the surface of the conductive seed layer 410 is a chemical plating metal, and the formed metal plating layer 430 may be used as the chemical plating metal layer of the present disclosure.

In an embodiment of the present disclosure, the metal plating layer 430 on the surface of the conductive seed layer 410 is formed in the lead opening 421 by the electroplating process. Since the conductive seed layer 410 is a whole-surface metal, the entire conductive seed layer 410 may be easily applied with a plating current and the conductive seed layer 410 has a small voltage drop, which can improve the uniformity of the electroplating rates at the positions of the respective lead openings 421, and then improves the uniformity of the surfaces of the precursor growth leads 431 away from the base substrate 100. The preparation method of the present disclosure does not need to design an additional connection lead to ensure power supply to a patterned conductive seed layer 410, thereby not only simplifying the design process and preparation process of each first lead layer 201, but also enabling that the preparation method of the first lead layer 201 of the present disclosure may be applied to any film layer position, which overcomes the defect that copper electroplating process can only be performed on the first layer close to the substrate in the related art.

In the related art, the conductive seed layer needs to be patterned before electroplating, which requires designing an additional conductive lead to electrically connect respective seed leads to each other to ensure that current can be applied to the respective seed leads during the electroplating process. Since the conductive seed layer is patterned into seed leads, it is difficult to maintain uniformity of the electroplating current densities on the respective seed leads, which is not conducive to the uniform growth of electroplating metals on different seed leads. In addition, the plating metal may grow on the side of the seed lead during the electroplating process, so that the metal plating layer completely covers the seed lead, which reduces the pattern-defining effect of the seed lead on the metal plating layer. More importantly, since the additional conductive lead needs to be designed to connect the respective seed leads, such method is only applicable to the metal wiring layer close to the base substrate, but cannot be applied to any metal wiring layers.

In an embodiment, the thicknesses of respective precursor growth leads 431, that is, the thickness of the metal plating layer 430, may be controlled by controlling parameters of the electroplating process or the chemical plating process, such as electroplating current, electroplating time and other parameters. In an embodiment, in step S230, the thickness of the metal plating layer 430 may be no greater than five times the width of the lead opening 421. In other words, the minimum value of the width of the lead opening 421 is a first size value, that is, the minimum value of the width of the precursor growth lead 431 on the side close to the base substrate 100 is the first size value. The thickness of the metal plating layer 430 is a second size value, that is, the thickness of the precursor growth lead 431 is the second size value. The second size value is not greater than 5 times the first size value. In this way, an aspect ratio of the prepared precursor growth lead 431 is not greater than 5, which may improve a bonding strength between the precursor growth lead 431 and the conductive seed layer 410, avoid collapse of the precursor growth lead 431, and improve stability of the precursor growth lead 431. In this way, as for the first lead 2011 formed after step S250, the thickness of the first lead 2011 is not greater than 5 times the width of the seed lead 411.

In an embodiment, the thickness of the metal plating layer 430 is 1.5 to 20 microns, for example, 2 microns, 5 microns, 10 microns, 20 microns, and the like. In an embodiment, the thickness of the metal plating layer 430 is 5 to 10 microns.

In an embodiment, the thickness of the metal plating layer 430 is greater than the thickness of the conductive seed layer 410 to ensure that the thickness of the first lead 2011 is greater than the thickness of the conductive seed layer 410 to achieve the purpose of increasing the thickness of the first lead 2011.

In an embodiment, the material of the metal plating layer 430 may be copper through a copper electroplating process or a copper-chemical plating process. In this way, the resistance of the growth lead 432 may be reduced, thereby reducing the resistance of the first lead 2011. Further, the surface of the conductive seed layer 410 far from the base substrate 100 includes at least one copper metal layer to ensure that the copper metal plating layer 430 may be smoothly grown on the surface of the conductive seed layer 410 in the electroplating process or the copper-chemical plating process.

In step S250, as shown in FIG. 9, the portion of the conductive seed layer 410 not covered by the metal plating layer 430 may be removed by etching. In an embodiment, an appropriate etching process may be selected according to the thickness and material of the conductive seed layer 410, which includes selecting an appropriate etching solution, etching time, etc., so as to cleanly etch the exposed portion of the conductive seed layer 410.

When the conductive seed layer 410 is etched, no special protection for the metal plating layer 430 may be required. In this way, the surface of each precursor growth lead 431 of the metal plating layer 430 is partially etched in the etching process, and the remaining part thereof forms the growth lead 432 of the first lead 2011. In some embodiments, the metal plating layer 430 and the conductive seed layer 410 may be etched at similar speeds, so that the thickness of the formed first lead 2011 is close to the thickness of the metal plating layer 430. For example, if the thickness of the metal plating layer 430 is 1.5 to 20 microns, the thickness of the formed first lead 2011 is 1.5 to 20 microns.

In some embodiments, the surface of the precursor growth lead 431 away from the base substrate 100 has a slightly rough surface, and the protruding part of the surface is more easily etched by the etching solution, thereby making the flatness of the surface of the precursor growth lead 431 away from the base substrate 100 is continuously improved during the etching process. Further, since there is no need to protect the metal plating layer 430, in the formed first lead 2011, the orthographic projection of the growth lead 432 on the base substrate 100 coincides with the orthographic projection of the seed lead 411 on the base substrate 100, which ensures the flatness of the side surface of the first lead 2011, and avoids the problem that the seed lead 411 protrudes from the growth lead 432. Therefore, the flatness of the surface and the side surface of the first lead 2011 is higher, which may further improve the morphology of the first lead 2011 and improve the performance of the array substrate.

In this way, using the method for manufacturing an array substrate provided by the present disclosure, as shown in FIG. 1, FIG. 2 and FIG. 9, the manufactured array substrate includes the base substrate 100, the driving circuit layer 200 and the functional device layer 300 that are stacked in sequence. The driving circuit layer 200 includes at least one first lead layer 201, any one of first lead layers 201 includes at least one first lead 2011, and any one of the first leads 2011 includes the seed lead 411 disposed on a side of the base substrate 100 and the growth lead 432 disposed on the surface of the seed lead 411 away from the base substrate 100. The orthographic projection of the growth lead 432 on the base substrate 100 coincides with the orthographic projection of the seed lead 411 on the base substrate 100.

In an embodiment of the present disclosure, as shown in FIG. 4, the method for manufacturing an array substrate provided by the present disclosure may further include forming an alignment mark layer 110 at the side of the base substrate 100, and the alignment mark layer 110 has an alignment pattern 111 for alignment. Then, the driving circuit layer 200 is formed on the side of the alignment mark layer 110 away from the base substrate 100. In this way, it may avoid that the pattern of the first lead layer 201 is used as the alignment pattern 111, so as to avoid the problem that the first lead layer 201 is too thick and the edge thereof is not clear.

In an embodiment, the material of the alignment mark layer 110 may be metal, metal oxide, silicon or other materials, for example, the material of the alignment mark layer 110 may be a metal such as molybdenum, titanium, copper, aluminum, tungsten, etc., or may be ITO (indium zinc oxide) and other metal oxides, or may be a material such as amorphous silicon and polysilicon. In an embodiment of the present disclosure, the material of the alignment mark layer 110 is molybdenum.

In an embodiment, a buffer layer 120 may also be disposed between the alignment mark layer 110 and the driving circuit layer 200, and the buffer layer 120 is formed of an insulating material to isolate the alignment mark layer 110 from the driving circuit layer 200.

It can be understood that, when the structure of another film layer of the array substrate may be used as an alignment pattern, the alignment mark layer 110 may not need to be provided. For example, if the prepared driving circuit layer 200 includes an active driving circuit, an active layer pattern of the active driving circuit may be used as the alignment pattern 111.

Figure 13:
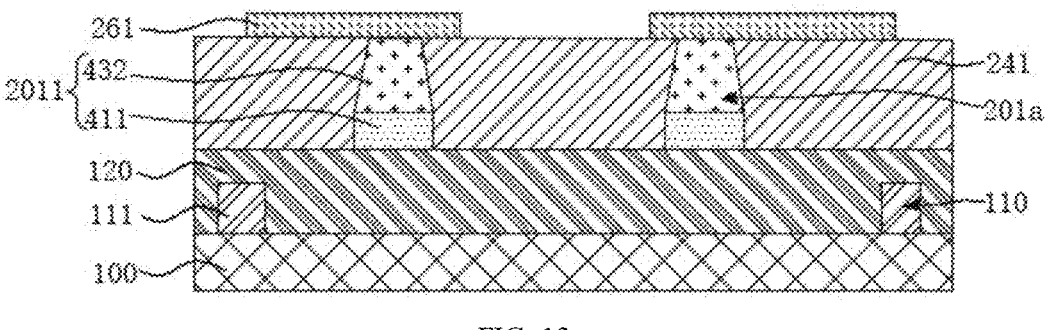
FIG. 13 is a schematic structural diagram of forming a first transition metal layer at a side of a first planarization layer away from a base substrate according to an embodiment of the present disclosure.
Figure 14:
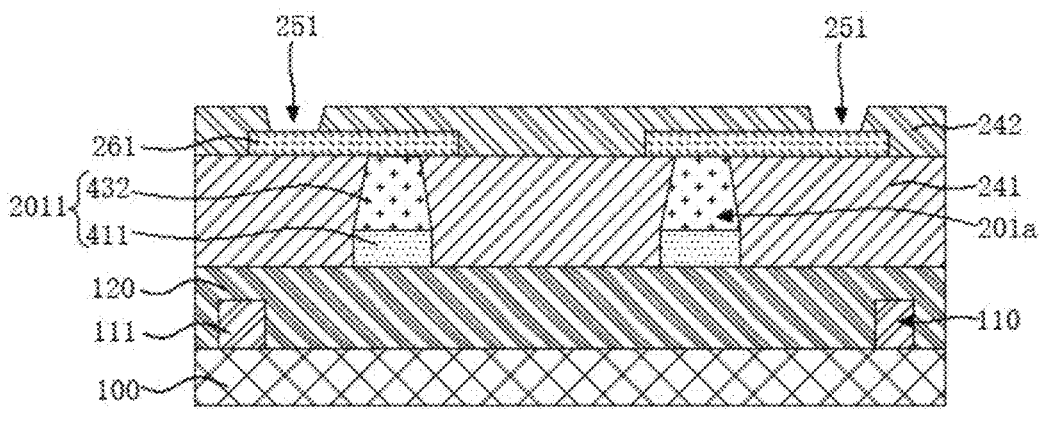
FIG. 14 is a schematic structural diagram of forming a second planarization layer at a side of a first transition metal layer away from a base substrate according to an embodiment of the present disclosure.
Figure 15:
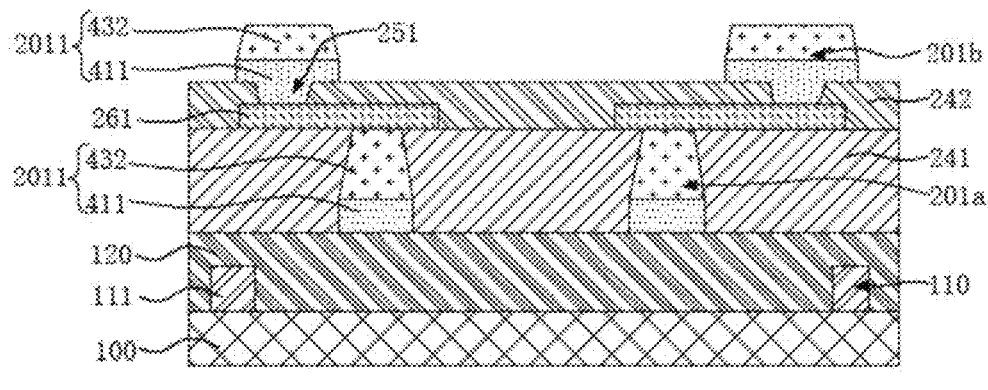
FIG. 15 is a schematic structural diagram of forming a later first lead layer on a surface of a second planarization layer away from a base substrate according to an embodiment of the present disclosure.
Figures 16, 17:
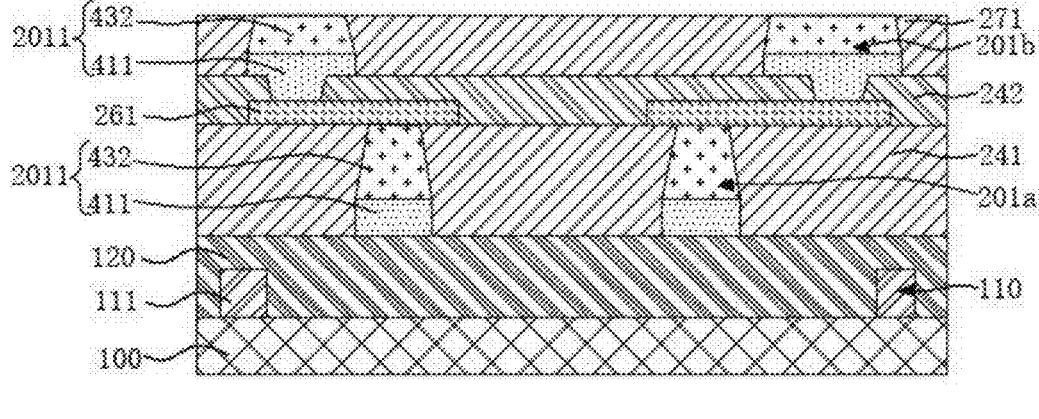
FIG. 16 is a schematic structural diagram of forming a pixel definition layer at a side of a driving circuit layer away from a base substrate according to an embodiment of the present disclosure.
FIG. 17 is a schematic structural diagram of forming a functional device layer at a side of a driving circuit layer away from a base substrate according to an embodiment of the present disclosure.

In some embodiments, as shown in FIG. 17, when preparing the driving circuit layer 200, two stacked first lead layers 201 which are connected by a transition metal layer may also be prepared. As shown in FIG. 11, forming at least one first lead layer 201 at the side of the base substrate 100 may include:

step S310, as shown in FIG. 12, forming one first lead layer 201 at the side of the base substrate 100;

step S320, as shown in FIG. 12, forming a first planarization layer 241 at a side of the first lead layer 201 away from the base substrate 100, the first planarization layer 241 exposing at least part of the first lead layer 201;

step S330, as shown in FIG. 13, forming a first transition metal layer 261 at a side of the first planarization layer 241 away from the base substrate 100, the first transition metal layer 261 being connected to the first lead layer 201;

step S340, as shown in FIG. 14, forming a second planarization layer 242 at a side of the first transition metal layer 261 away from the base substrate 100, the second planarization layer 242 having a first connection via hole 251, the first connection via hole 251 exposing a part of the first transition metal layer 261, and an orthographic projection of the first connection via hole 251 on the first lead layer 201 not overlapping with the first lead layer 201; and step S350, as shown in FIG. 15, forming another first lead layer on a surface of the second planarization layer 242 away from the base substrate 100, the another first lead layer 201 being connected to the first transition metal layer 261 through the first connection via hole 251.

In this way, as shown in FIG. 17, in the array substrate manufactured according to the manufacturing method, the driving circuit layer 200 may include a previous first lead layer 201a, the first planarization layer 241, the first transition metal layer 261, the second planarization layer 242 and a next first lead layer 201b stacked in sequence, and the previous first lead layer 201a and the next first lead layer 201b form a first lead layer group connected by the first transition metal layer 261. The previous first lead layer 201a is disposed at the side of the base substrate 100; the first planarization layer 241 is disposed at the side of the previous first lead layer 201a away from the base substrate 100, and exposes at least part of the previous first lead layer 241; the first transition metal layer 261 is disposed at the side of the first planarization layer 241 away from the base substrate 100 and is connected to the previous first lead layer 201a; the second planarization layer 242 is disposed at the side of the first transition metal layer 261 away from the base substrate 100 and is provided with the first connection via hole 251; the first connection via hole 251 exposes a part of the first transition metal layer 261, and the orthographic projection of the first connection via hole 251 on the previous first lead layer 201a is not overlapped with the previous first lead layer 201a; and the next first lead layer 201b is disposed on the surface of the second planarization layer 242 away from the base substrate 100, and is connected through the first connection via hole 251 to the first transition metal layer 261.

In step S310, the previous first lead layer 201a may be formed at the side of the base substrate 100 through steps S210 to S250.

In an embodiment of the present disclosure, before step S320, a first passivation layer may also be formed on the surface of the previous first lead layer 201a away from the base substrate 100, and the first passivation layer is used to protect the first lead 2011 from being eroded. The first passivation layer exposes at least part of the previous first lead layer 201a, so that the previous first lead layer 201a may be electrically connected to the first transition metal layer 261.

In step S320, as shown in FIG. 12, the first planarization layer 241 may be formed at the side of the previous first lead layer 201a away from the base substrate 100, and the first planarization layer 241 may fill the gap between the respective first leads 2011 to provide a planarized surface for the first transition metal layer 261. The material of the first planarization layer 241 may be an inorganic material, such as silicon oxide, silicon nitride, or the like, or may be an organic material, for example a resin material such as epoxy resin and polyimide. In an embodiment of the present disclosure, the material of the first planarization layer 241 is a resin material.

In step S330, as shown in FIG. 13, the first transition metal layer 261 may be formed at the side of the first planarization layer 241 away from the base substrate 100, and the first transition metal layer 261 is used to connect the previous first lead layer 201a to the next first lead layer 201b.

In an embodiment, a transition metal material layer may be formed by a deposition method such as magnetron sputtering, and then a patterning operation is performed on the transition metal material layer to form the first transition metal. The first transition metal layer may be one layer of conductive material, or may be a stack of multiple layers of conductive material. In an embodiment of the present disclosure, the first transition metal layer 261 may include a first conductive material layer, a second conductive material layer, and the first conductive material layer stacked in sequence, that is, a sandwich structure. The first conductive material layer may be formed of corrosion-resistant metal or alloy, such as molybdenum or titanium; and the second conductive material layer may be formed of metal or alloy with high conductivity, such as copper, aluminum, silver or the like. For example, the first transition metal layer 261 may include a titanium metal layer, an aluminum metal layer, and the titanium metal layer stacked in sequence, the thickness of the titanium metal layer may be 400 to 600 angstroms, and the thickness of the aluminum metal layer may be 3500 to 5500 angstroms. In another embodiment of the present disclosure, the material of the first transition metal layer 261 may be the same as the material of the conductive seed layer 410. For example, the first transition metal layer 261 includes an MTD alloy layer and a copper layer stacked in sequence, the thickness of the MTD alloy layer is 250 to 350 angstroms, and the thickness of the copper layer is 2500 to 3500 angstroms.

In an embodiment of the present disclosure, if the surface of the first transition metal layer away from the base substrate 100 is a metal material that is easily eroded, such as copper or aluminum, a second passivation layer may be further formed on the surface of the first transition metal layer 261 away from the base substrate 100 before step S340. The second passivation layer is used to protect the first transition metal layer 261 from being eroded. The second passivation layer exposes at least part of the first transition metal layer 261, so that the next first lead layer 201b may be electrically connected to the first transition metal layer 261.

In step S340, as shown in FIG. 14, the second planarization layer 242 may be formed at the side of the first transition metal layer 261 away from the base substrate 100. In an embodiment, the material and preparation method of the second planarization layer 242 may be the same as or different from those of the first planarization layer 241, which are not particularly limited in the present disclosure.

The second planarization layer 242 has the first connection via hole 251. The first connection via hole 251 exposes a part of the first transition metal layer 261, and the orthographic projection of the first connection via hole 251 on the previous first lead layer 201a is not overlapped with the previous first lead layer 201a. In this way, the first transition metal layer 261 includes at least a first connection area and a second connection area that do not overlap with each other. The first connection area is electrically connected to the previous first lead layer 201a, and the second connection area is electrically connected to the next first lead layer 201b. Such arranging manner may prevent the unevenness of the previous first lead layer 201a from being conducted to the next first lead layer 201b, so that the next first lead layer 201b may have a good morphology without being degraded by the previous first lead layer 201b. In particular, this may also avoid the continuous formation of a plurality of thick metal layers at the same position, improve the stability of each first lead 2011 in the first lead layer 201 and improve the stress of the array substrate.

In step S350, as shown in FIG. 15, the next first lead layer 201b may be formed at the side of the base substrate 100 through steps S210 to S250. In an embodiment of the present disclosure, a third passivation layer may also be formed on the surface of the next first lead layer 201b away from the base substrate 100, and the third passivation layer is used to protect the next first lead layer 201b from being eroded. The third passivation layer exposes at least a part of the next first lead layer 201b, so that the next first lead layer 201b may be electrically connected to other structures of the array substrate.

Figure 18:
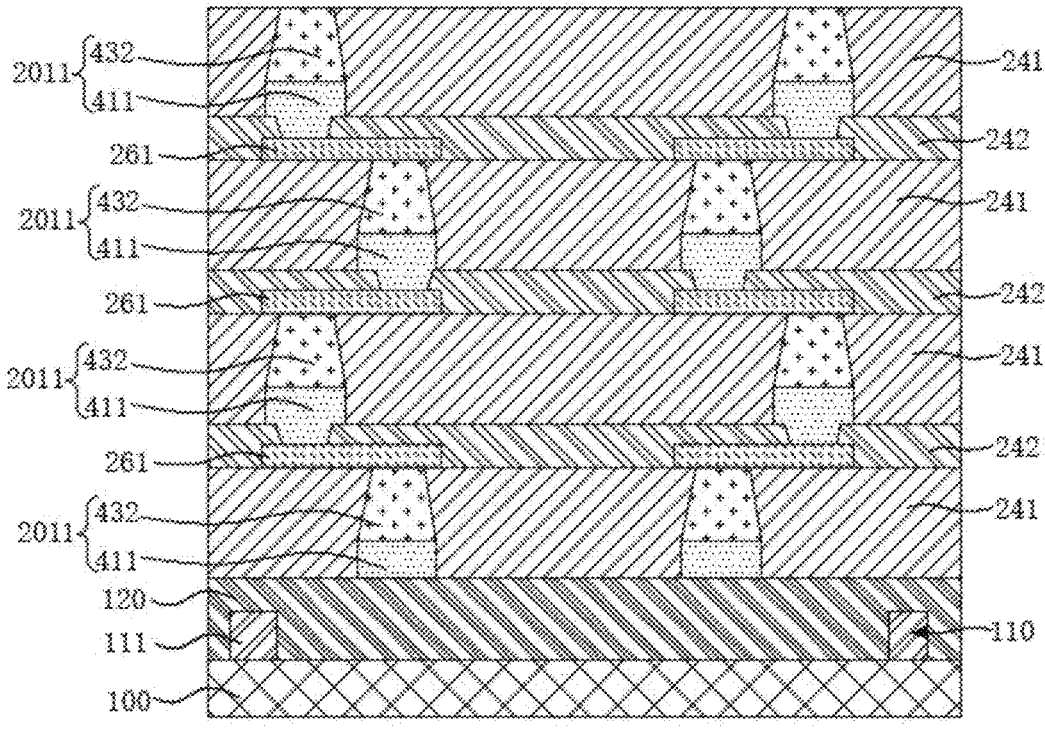
FIG. 18 is a schematic structural diagram of a driving circuit layer having a plurality of first lead layers stacked in sequence according to an embodiment of the present disclosure.

It can be understood that, according to the manufacturing method of the array substrate provided by the present disclosure, in some embodiments, as shown in FIG. 18, the formed array substrate may have a plurality of first lead layers 201, for example, may have three, four or five first lead layers 201. A first lead layer group may be formed by two adjacent first lead layers 201. The first lead layer 201 in the first lead layer group close to the base substrate 100 may be the previous first lead layer 201ap, the first lead layer 201 in the first lead layer group far from the base substrate 100 may be the next first lead layer 201b, and the previous first lead layer 201a and the next first lead layer 201b may electrically connected to each other through the first transition metal layer 261 sandwiched between the two first lead layers 201. In an embodiment of the present disclosure, when a conductive lead layer needs to have a very thick thickness according to the performance requirements of the array substrate, in order to avoid the problem of easy collapse of the growth lead 432 due to the growth lead 432 being formed too thick by one electroplating or chemical plating process, each conductive lead layer may be divided into a plurality of first lead layers 201 stacked in sequence, and two adjacent first lead layers 201 are electrically connected through the first transition metal layer 261. In this way, the effect of the plurality of first lead layers 201 electrically connected to each other may be equal to the required very thick conductive lead layer, thereby improving the manufacturing process feasibility and yield of the array substrate.

In an embodiment of the present disclosure, as shown in FIG. 19 and FIG. 20, step S120 may include steps S410 to S450 to form the driving circuit layer 200, and the driving circuit layer 200 has a driving transistor 210 and the driving transistor 210 is connected to the first lead layer 201.

In step S410, the driving transistor 210 is formed at the side of the base substrate 100. The driving transistor 210 includes a source-drain electrode layer composed of a source electrode and a drain electrode, and the source-drain electrode layer is located in the source-drain metal layer of the driving circuit layer.

In an embodiment, the driving transistor 210 may be formed at the side of the base substrate 100 by the following method, In step S411, an active layer, a gate insulating layer and a gate layer is formed at the side of the base substrate 100 to form a semiconductor layer and a gate of the driving transistor 210. The semiconductor layer of the driving transistor 210 is located in the active layer, and includes a channel region and a source contact region and a drain contact region at both sides of the channel region. The gate of the driving transistor is located in the gate layer; and the channel region and the gate of the semiconductor layer are separated by the gate insulating layer.

In step S412, an interlayer dielectric layer 220 is formed, and the active layer, the gate insulating layer and the gate layer are all located between the interlayer dielectric layer 220 and the base substrate 100. The interlayer dielectric layer 220 is provided with second connection via holes 252, and the second connection via holes 252 expose the source contact region and the drain contact region.

In step S413, a source-drain metal layer 230 is formed at the side of the interlayer dielectric layer 220 away from the base substrate 100, and the source-drain metal layer 230 is formed with the source electrode and the drain electrode of the driving transistor, and the source electrode and the drain electrode constitute the source-drain meal layer of the driving transistor. The source electrode is connected to the source contact region through the second connection via hole 252, and the drain electrode is connected to the drain contact region through the second connection via hole 252.

In an embodiment, the material and thickness of the source-drain metal layer 230 may be the same as or different from those of the first transition metal layer 261.

In an embodiment, after the source-drain metal layer 230 is formed, a passivation layer may also be formed on the surface of the source-drain metal layer 230 away from the base substrate 100. It can be understood that the passivation layer exposes at least part of the source-drain metal layer 230, so that the source-drain metal layer 230 may be electrically connected to other conductive structures of the driving circuit layer 200.

In step S420, a third planarization layer 243 is formed at the side of the driving transistor 210 away from the base substrate 100. The third planarization layer 243 is provided with a third connection via hole 253 exposing at least part of the source-drain electrode layer.

In an embodiment, the material of the third planarization layer 243 may be the same as or different from that of the first planarization layer 241.

In an embodiment, the orthographic projection of the third connection via hole 253 on the base substrate 100 does not overlap with the orthographic projection of the second connection via hole 252 on the base substrate 100. In this way, the third connection via hole 253 may expose the flat surface of the source-drain metal layer 230, which helps to improve the connection strength between the exposed source-drain metal layer 230 and other conductive structures of the driving circuit.

In step S430, a second transition metal layer 262 is formed at the side of the third planarization layer 243 away from the base substrate 100. The second transition metal layer 262 is connected to the source-drain metal layer 230 through the third connection via hole 253.

In an embodiment, the material and thickness of the second transition metal layer 262 may be the same as or different from those of the first transition metal layer 261.

In step S440, a fourth planarization layer 244 is formed at the side of the second transition metal layer 262 away from the base substrate 100. The fourth planarization layer 244 has a fourth connection via hole 254, the fourth connection via hole 254 exposes a portion of the second transition metal layer 262, and the orthographic projection of the fourth connection via hole 254 on the base substrate 100 does not overlap with the orthographic projection of the third connection via hole 253 on the base substrate 100.

In this way, the second transition metal layer 262 includes at least a third connection region and a fourth connection region that do not overlap with each other. The third connection region is electrically connected to the source-drain metal layer 230, and the fourth connection region is electrically connected to the first lead layer 201. Such arranging manner may prevent the unevenness of the source-drain metal layer 230 from being conducted to the first lead layer 201, so that the first lead layer 201 may have a good morphology without being degraded by the source-drain metal layer 230.

In an embodiment, the material of the fourth planarization layer 244 may be the same as or different from that of the first planarization layer 241.

In step S450, the first lead layer 201 is formed on the surface of the fourth planarization layer 244 away from the base substrate 100. The first lead layer 201 is connected to the second transition metal layer 262 through the fourth connection via hole 254. The first lead layer 201 may be formed according to the method shown in steps S210 to S250.

In this way, according to the manufacturing method of the array substrate described in the embodiment, as shown in FIG. 20, the prepared driving circuit layer 200 may include the driving transistor 210, the third planarization layer 243, the second transition metal layer 262, the fourth planarization layer 244 and the first lead layer 201 stacked in sequence.

The driving transistor 210 is disposed at the side of the base substrate 100, and the driving transistor 210 includes a source-drain electrode layer composed of a source electrode and a drain electrode. The third planarization layer 243 is disposed at the side of the driving transistor 210 away from the base substrate 100, and is provided with the third connection via hole 253 exposing at least part of the source-drain electrode layer. The second transition metal layer 262 is disposed at the side of the third planarization layer 243 away from the base substrate 100 and is connected to the source-drain electrode layer through the third connection via hole 253. The fourth planarization layer 244 is disposed at the side of the second transition metal layer 262 away from the base substrate 100, and has the fourth connection via hole 254. The fourth connection via hole 254 exposes a part of the second transition metal layer 262, and the orthographic projection of the fourth connection via hole 254 on the base substrate 100 does not overlap with the orthographic projection of the third connection via hole 253 on the base substrate 100. The first lead layer 201 is disposed on the surface of the four planarization layer 244 away from the base substrate 100 and is connected to the second transition metal layer 262 through the fourth connection via hole 254.

In another embodiment of the present disclosure, as shown in FIG. 21 and FIG. 22, step S120 may include steps S510 to S530 to form the driving circuit layer 200, so that the driving circuit layer 200 has a driving transistor 210 and the first lead layer 201 connected to the first transistor 210.

In step S510, the driving transistor 210 is formed at the side of the base substrate 100. The driving transistor 210 includes a source-drain electrode layer composed of a source electrode and a drain electrode, and the source-drain electrode layer is located in the source-drain metal layer of the driving circuit layer.

In step S520, a third planarization layer 243 is formed at the side of the driving transistor 210 away from the base substrate 100. The third planarization layer 243 is provided with a third connection via hole 253 exposing at least part of the source-drain electrode layer.

In an embodiment, the orthographic projection of the third connection via hole 253 on the base substrate 100 does not overlap with the orthographic projection of the second connection via hole 252 on the base substrate 100.

In an embodiment, steps S510 to S520 may be implemented with reference to the preparation methods shown in steps S410 to S420.

In step S530, the first lead layer 201 is formed on the surface of the third planarization layer 243 away from the base substrate 100. The first lead layer 201 is connected to the source-drain electrode layer through the third connection via hole 253. The first lead layer 201 may be formed according to the methods shown in steps S210 to S250.

In this way, according to the manufacturing method of the array substrate described in this embodiment, as shown in FIG. 22, the prepared driving circuit layer 200 may include the driving transistor 210, the third planarization layer 243 and the first lead layer 201 stacked in sequence.

The drive transistor 210 is disposed at the side of the base substrate, and the drive transistor 210 includes a source-drain electrode layer composed of a source electrode and a drain electrode. The third planarization layer 243 is disposed at the side of the source-drain electrode layer away from the base substrate 100, and is provided with the third connection via hole 253 exposing at least a part of the source-drain electrode layer. The first lead layer 201 is disposed on the surface of the third planarization layer 243 away from the base substrate 100 and is connected to the source-drain electrode layer through the third connection vial hole 253.

According to the array substrate manufactured in the embodiment, the source-drain metal layer 230 may be reused as the second transition metal layer 262, so it is not necessary to prepare the second transition metal layer 262 and the fourth planarization layer 244. Therefore, at least two patterning processes are reduced in the process, related materials are saved, two film layers may be reduced in the formed array substrate. In this way, the manufacturing method shown in the embodiment may reduce the manufacturing cost of the array substrate and improve the manufacturing efficiency, and can make the array substrate have a smaller thickness.

In another embodiment of the present disclosure, as shown in FIG. 23 and FIG. 24, step S120 may include steps S610 to S630 to form the driving circuit layer 200, so that the driving circuit layer 200 has the driving transistor 210 and the first lead layer 201 connecting to the driving transistor 210.

In step S610, an active layer, a gate insulating layer and a gate layer are formed at the side of the base substrate 100 to form a semiconductor layer and a gate of the driving transistor 210. The semiconductor layer of the driving transistor 210 is located in the active layer, and includes a channel region and a source contact region and a drain contact region on both sides of the channel region. The gate of the driving transistor 210 is located in the gate layer, and the channel region and the gate of the semiconductor layer are separated by the gate insulating layer.

In step S620, an interlayer dielectric layer 220 is formed. The active layer, the gate insulating layer and the gate layer are all located between the interlayer dielectric layer 220 and the base substrate 100. The interlayer dielectric layer 220 is provided with a second connection via hole 252, and the second connection via hole 252 exposes the source contact region and the drain contact region.

In step S630, a first lead layer 201 is formed at the side of the interlayer dielectric layer 220 away from the base substrate 100. The first lead layer 201 is formed with a source electrode and a drain electrode, and the source electrode is connected to the source contact region through the second via hole 252, and the drain electrode is connected to the drain contact area through the second connection via hole 252.

In this way, according to the manufacturing method of the array substrate described in the embodiment, as shown in FIG. 24, the prepared driving circuit layer 200 may include a driving transistor, and the driving transistor includes a semiconductor layer, an interlayer dielectric layer and a first lead layer. The semiconductor layer is arranged at the side of the base substrate. The semiconductor layer includes a source contact region and a drain contact region. The interlayer dielectric layer is arranged at the side of the semiconductor layer away from the base substrate. The first lead layer is disposed at the side of the interlayer dielectric layer away from the base substrate, and is formed with a source electrode and a drain electrode. The source electrode is connected to the source contact region, and the drain electrode is connected to the source contact region.

According to the array substrate manufactured in the embodiment, the first lead layer 201 may be reused as the source-drain metal layer 230, which may further reduce the patterning process and film layer materials during the manufacturing of the array substrate, reduce the manufacturing cost of the array substrate, and further reduce the thickness of the array substrate.

In step S130, the functional device layer 300 may be formed at the side of the driving circuit layer 200 away from the base substrate 100. The functional device layer 300 may include functional devices 310 distributed in an array, for example, including light emitting devices for emitting light, ultrasonic emitting devices for emitting ultrasonic waves, heating devices for generating heat, or other current-driven functional devices 310.

In an embodiment, the driving circuit layer 200 may include an electrode layer, and each functional device 310 may be electrically connected to the electrode layer. The electrode layer may be the first lead layer 201 or the second lead layer 202, which is not specifically limited in the present disclosure. Further, the connection electrode layer may include a first electrode and a second electrode which are adjacently disposed. A first end of the functional device 310 may be electrically connected to the first electrode, and a second end of the functional device 310 may be electrically connected to the second electrode. In this way, a driving current may flow through the functional device 310 through the first electrode and the second electrode, so that the functional device 310 works.

In some embodiments, as shown in FIG. 16 and FIG. 17, a pixel definition layer 271 may be formed at the side of the driving circuit layer away from the base substrate, and then a conductive adhesive 272 may be coated in the area defined by the pixel definition layer 271, and the functional device 310 is electrically connected to the electrode layer through the conductive adhesive 272.

For example, the functional device 310 may be an LED, a Mini LED or a Micro LED, and the Mini LED or the Micro LED may be connected to the electrode layer through solder paste.

In an embodiment, the manufacturing method of the array substrate of the present disclosure may further include:

preparing a fan-out lead on a side surface of the base substrate 100, the fan-out lead being electrically connected to the driving circuit layer 200; and preparing a bonding layer at the side of the base substrate 100 away from the driving circuit layer 200, the bonding layer having a plurality of bonding pads, and each bonding pad being electrically connected to the driving circuit layer 200 through the fan-out lead.

In this way, the manufactured array substrate may include the base substrate 100, the driving circuit layer 200 and the functional device layer 300 stacked in sequence, the bonding layer located at the side of the base substrate 100 away from the driving circuit layer 200, and the fan-out lead located on the side surface of the base substrate 100. In this way, the array substrate may have a smaller edge, so that a larger substrate may be formed by splicing a plurality of different array substrates, and the larger substrate has a smaller splicing seam.

For example, when the functional device 310 is a Micro LED, a plurality of different small-sized array substrates may be spliced to form a large-sized display screen, and the splicing size of the display screen may be very small, thereby achieving a good display effect. The driving circuits of respective array substrates, such as driving circuit boards and driving chips disposed on the driving circuit boards, may be electrically connected through bonding pads to realize the driving of the array substrates.

Figure 25:
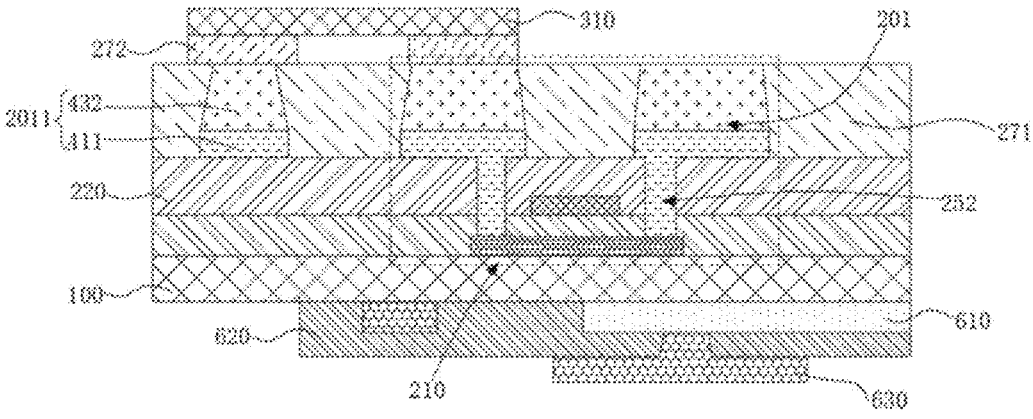
FIG. 25 is a schematic structural diagram of an array substrate according to an embodiment of the present disclosure.

In an embodiment of the present disclosure, as shown in FIG. 25, the bonding layer may include a backside lead layer 610, an insulating layer 620 and a bonding pad layer 630 sequentially stacked on the surface of the base substrate 100 away from the driving circuit layer 200. The backside lead layer 610 may be electrically connected to the fan-out lead (not shown in FIG. 25), and the insulating layer 620 exposes a part of the backside lead layer 610 so that the bonding pad layer 630 may be electrically connected to the backside lead layer 610.

In an embodiment, the backside lead layer 610 may also be provided with a backside alignment pattern, and the material of the backside alignment pattern may be the same as or different from the backside lead layer 610. For example, the materials of the backside alignment pattern and the bonding pad layer 630 are both ITO.

It should be noted that although the various steps of the method of the present disclosure are described in a specific order in the drawings, this does not require or imply that the steps must be performed in this specific order, or that all of the steps shown must be performed in order to achieve the desired result. Additionally or alternatively, certain steps may be omitted, multiple steps may be combined into one step for execution, and/or one step may be decomposed into multiple steps for execution, etc., all of which should be considered as part of the present disclosure.

An embodiment of the present disclosure further provides an array substrate, as shown in FIG. 1 and FIG. 2, the array substrate includes a base substrate 100, a driving circuit layer 200 and a functional device layer 300 that are stacked in sequence.

The driving circuit layer 200 includes at least one first lead layer 201, and any one of the first lead layer 201 includes at least one first lead 2011, any one of the first lead 2011 includes a seed lead 411 provided at a side of the base substrate 100 and a growth lead 432 provided on a surface of the seed lead 411 away from the base substrate 100, and an orthographic projection of the growth lead 432 on the base substrate 100 coincides with an orthographic projection of the seed lead 411 on the base substrate 100.

The array substrate provided in the present disclosure may be manufactured by any one of the manufacturing methods described in the above-mentioned embodiments of the manufacturing method of the array substrate, and therefore has the same or similar technical effects, which will not be repeated in the present disclosure.

In an embodiment of the present disclosure, a thickness of the first lead 2011 is not greater than five times a width of the seed lead 411.

In an embodiment of the present disclosure, the thickness of the first lead 2011 is 1.5 μm to 20 μm.

In an embodiment of the present disclosure, a width of an end of the first lead 2011 away from the base substrate 100 is smaller than a width of an end of the first lead 2011 close to the base substrate 100.

In an embodiment of the present disclosure, as shown in FIG. 17 and FIG. 18, the driving circuit layer 200 includes:

one first lead layer 201*a*, provided at a side of the base substrate 100;

a first planarization layer 241, provided at a side of the first lead layer 201*a* away from the base substrate 100 and exposing at least a part of the first lead layer 201*a*;

a first transition metal layer 261, provided at a side of the first planarization layer 241 away from the base substrate 100 and connected to the first lead layer 201*a*;

a second planarization layer 242, provided at a side of the first transition metal layer 261 away from the base substrate 100 and provided with a first connection via hole 251, the first connection via hole 251 exposing a part of the first transition metal layer 261, and an orthographic projection of the first connection via hole 251 on the first lead layer 201*a* not overlapping with the first lead layer 201*a*;

another first lead layer 201*b*, provided on a surface of the second planarization layer 242 away from the base substrate 100 and connected to the first transition metal layer 261 through the first connection via hole 251.

In other words, the driving circuit layer 200 includes at least one first lead layer group, and any first lead layer group includes:

a previous first lead layer 201*a*, provided at a side of the base substrate 100;

the first planarization layer 241, provided at a side of the previous first lead layer 201*a* away from the base substrate 100 and exposing at least a part of the previous first lead layer 201*a*;

the first transition metal layer 261, provided at a side of the first planarization layer 241 away from the base substrate 100 and connected to the previous first lead layer 201*a*;

the second planarization layer 242, provided at a side of the first transition metal layer 261 away from the base substrate 100 and provided with a first connection via hole 251, the first connection via hole 251 exposing a part of the first transition metal layer 261, and an orthographic projection of the first connection via hole 251 on the previous first lead layer 201*a* not overlapping with the previous first lead layer 201*a;* another first lead layer 201*b*, provided on a surface of the second planarization layer 242 away from the base substrate 100 and connected to the first transition metal layer 261 through the first connection via hole 251.

In an embodiment of the present disclosure, as shown in FIG. 20, the driving circuit layer 200 includes:

a driving transistor 210, provided at the side of the base substrate, and including a source-drain electrode layer having a source electrode and a drain electrode;

a third planarization layer 243, provided at a side of the source-drain electrode layer away from the base substrate 100, and provided with a third connection via hole 253 exposing at least part of the source-drain electrode layer;

a second transition metal layer 262, provided at a side of the third planarization layer 243 away from the base substrate 100, and connected to the source-drain electrode layer through the third connection via hole 253;

a fourth planarization layer 244, provided at a side of the second transition metal layer 262 away from the base substrate 100, and having a fourth connection via hole 254, the fourth connection via hole 254 exposing a part of the second transition metal layer 262, and an orthographic projection of the fourth connection via hole 254 on the base substrate 100 not overlapping with an orthographic projection of the third connection via hole 253 on the base substrate 100; and one first lead layer 201, provided on a surface of the fourth planarization layer 244 away from the base substrate 100, and connected to the second transition metal layer 262 through the fourth connection via hole 254.

In an embodiment of the present disclosure, as shown in FIG. 22, the driving circuit layer 200 includes:

a driving transistor 210, provided at the side of the base substrate 100, and including a source-drain electrode layer having a source electrode and a drain electrode;

a third planarization layer 243, provided at a side of the source-drain electrode layer away from the base substrate 100, and provided with a third connection via hole 253 exposing at least part of the source-drain electrode layer;

a first lead layer 201, provided on a surface of the third planarization layer 243 away from the base substrate 100, and connected to the source-drain electrode layer through the third connection via hole 253.

In an embodiment of the present disclosure, as shown in FIG. 24, the driving circuit layer 200 includes a driving transistor, and the driving transistor includes:

a semiconductor layer, provided at a side of the base substrate 100, and including a source contact region and a drain contact region;

an interlayer dielectric layer 220, provided at a side of the semiconductor layer away from the base substrate 100;

a first lead layer 201, provided at the side of the interlayer dielectric layer 220 away from the base substrate, and being formed with a source electrode and a drain electrode, the source electrode being connected to the source contact region, and the drain electrode being connected to the source contact region.

Other details and possible variations of the array substrate provided in the present disclosure are described in detail in the above-mentioned embodiments of the manufacturing method of the array substrate, which will not be repeated in the present disclosure.

An embodiment of the present disclosure further provides a display device, which includes any of the array substrates described in the foregoing array substrate embodiments. The display device may be a mobile phone screen, a computer screen, a television or other types of display devices. Since the display device has any of the array substrates described in the above-mentioned embodiments of the array substrate, it has the same beneficial effects, and details thereof are not described here in the present disclosure.

In an embodiment of the present disclosure, in the display device, at least some of the functional devices on the array substrate are light-emitting devices.

It should be understood that the application of the present disclosure is not limited to the detailed structure and arrangement of components set forth in the specification. The present disclosure may have other embodiments and can be implemented in various ways. Variations and modifications of the foregoing fall within the scope of the present disclosure. It will be understood that the present disclosure disclosed and defined in this specification extends to all alternative combinations of two or more of the individual features mentioned in or obvious from the text and/or drawings. All of these different combinations constitute various alternative aspects of the present disclosure. The embodiments in the specification illustrate the best implementation known for carrying out the present disclosure, so that a person skilled in the art may utilize the present disclosure.

What is claimed is:

1. A method for manufacturing an array substrate, comprising:

providing a base substrate;

forming a driving circuit layer at a side of the base substrate; and forming a functional device layer at a side of the driving circuit layer away from the base substrate, wherein forming the driving circuit layer at the side of the base substrate comprises:

forming at least one first lead layer at the side of the base substrate, forming any one of the first lead layer comprises:

forming a conductive seed layer at the side of the base substrate;

forming a removable pattern-defining layer on a surface of the conductive seed layer away from the base substrate, the removable pattern-defining layer being provided with a lead opening, and the lead opening exposing a part of the conductive seed layer;

forming, in the lead opening, a metal plating layer on the surface of the conductive seed layer by using an electroplating process or a chemical plating process;

removing the removable pattern-defining layer; and removing, by using an etching process, a part of the conductive seed layer not covered by the metal plating layer, wherein during the etching process, a surface of the metal plating layer away from the base substrate is etched partially, so that a thickness of an etched part of the metal plating layer is equal to a thickness of the conductive seed layer.

2. The method for manufacturing the array substrate according to claim 1, wherein forming the removable pattern-defining layer on the surface of the conductive seed layer away from the base substrate comprises:

forming a removable insulating material layer on the surface of the conductive seed layer away from the base substrate; and forming the removable pattern defining layer by performing a patterning operation on the removable insulating material layer.

3. The method for manufacturing the array substrate according to claim 2, wherein forming the removable insulating material layer on the surface of the conductive seed layer away from the base substrate comprises:

forming a photoresist material layer on the surface of the conductive seed layer away from the base substrate, and forming the removable pattern defining layer by performing the patterning operation on the removable insulating material layer comprises:

forming the removable pattern defining layer by exposing and developing the photoresist material layer.

4. The method for manufacturing the array substrate according to claim 3, wherein forming the photoresist material layer on the surface of the conductive seed layer away from the base substrate comprises:

forming the photoresist material layer on the surface of the conductive seed layer away from the base substrate by using a degradable photoresist material, the degradable photoresist material after curing being dissolvable in a degradation liquid, and removing the removable pattern-defining layer comprises:

dissolving the removable pattern-defining layer by using the degradation liquid.

5. The method for manufacturing the array substrate according to claim 3, wherein forming the photoresist material layer on the surface of the conductive seed layer away from the base substrate comprises:

forming the photoresist material layer on the surface of the conductive seed layer away from the base substrate by using a negative photoresist material, forming the removable pattern defining layer by exposing and developing the photoresist material layer comprises:

forming the removable pattern defining layer with the lead opening by exposing and developing the photoresist material layer so that a width of an end of the lead opening close to the base substrate is greater than a width of an end of the lead opening away from the base substrate.

6. The method for manufacturing the array substrate according to claim 1, wherein forming the removable pattern-defining layer on the surface of the conductive seed layer away from the base substrate comprises:

forming the removable pattern-defining layer on the surface of the conductive seed layer away from the base substrate, so that a minimum value of a width of the lead opening is a first dimension value, forming, in the lead opening, the metal plating layer on the surface of the conductive seed layer by using the electroplating process or the chemical plating process comprises:

forming, in the lead opening, the metal plating layer on the surface of the conductive seed layer by using the electroplating process or the chemical plating process, so that a thickness of the metal plating layer is a second dimension value not greater than five times the first dimension value.

7. The method for manufacturing the array substrate according to claim 1, wherein forming the at least one first lead layer at the side of the base substrate comprises:

forming one first lead layer at the side of the base substrate;

forming a first planarization layer at a side of the one first lead layer away from the base substrate, the first planarization layer exposing at least part of the one first lead layer;

forming a first transition metal layer at a side of the first planarization layer away from the base substrate, the first transition metal layer being connected to the one first lead layer;

forming a second planarization layer at a side of the first transition metal layer away from the base substrate, the second planarization layer having a first connection via hole, the first connection via hole exposing a part of the first transition metal layer, and an orthographic projection of the first connection via hole on the one first lead layer not overlapping with the one first lead layer; and forming another first lead layer on a surface of the second planarization layer away from the base substrate, the another first lead layer being connected to the first transition metal layer through the first connection via hole.

* * * * *